US011176979B2

(12) United States Patent
Wang et al.

(10) Patent No.: US 11,176,979 B2
(45) Date of Patent: Nov. 16, 2021

(54) COMPUTATIONAL RANDOM ACCESS MEMORY (CRAM) BASED ON SPIN-ORBIT TORQUE DEVICES

(71) Applicant: Regents of the University of Minnesota, Minneapolis, MN (US)

(72) Inventors: Jian-Ping Wang, Minneapolis, MN (US); Sachin S. Sapatnekar, Minneapolis, MN (US); Ulya R. Karpuzcu, Minneapolis, MN (US); Zhengyang Zhao, Minneapolis, MN (US); Masoud Zabihi, Minneapolis, MN (US); Michael Salonik Resch, Minneapolis, MN (US); Zamshed I. Chowdhury, Minneapolis, MN (US); Thomas Peterson, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 16/803,454

(22) Filed: Feb. 27, 2020

(65) Prior Publication Data
US 2020/0279597 A1    Sep. 3, 2020

Related U.S. Application Data

(60) Provisional application No. 62/811,915, filed on Feb. 28, 2019.

(51) Int. Cl.
*G11C 11/00* (2006.01)
*G11C 11/16* (2006.01)

(52) U.S. Cl.
CPC ........ *G11C 11/161* (2013.01); *G11C 11/1659* (2013.01); *G11C 11/1673* (2013.01); *G11C 11/1675* (2013.01); *G11C 11/1697* (2013.01)

(58) Field of Classification Search
CPC .............. G11C 11/161; G11C 11/1659; G11C 11/1673; G11C 11/1675; G11C 11/1697
(Continued)

(56) References Cited

U.S. PATENT DOCUMENTS 6,914,806 B2   7/2005  Kunikiyo
8,902,644 B2  12/2014  Sakimura et al.
(Continued)

FOREIGN PATENT DOCUMENTS

TW    201523604 A1   6/2015
WO    2019005129 A1   1/2019

OTHER PUBLICATIONS

Aga et al., Computer Caches, HPCA, 12 pages, 2017.
(Continued)

*Primary Examiner* — Huan Hoang
(74) *Attorney, Agent, or Firm* — Theodore M. Magee; Westman, Champlin & Koehler, P.A.

(57) ABSTRACT

A logic-memory cell includes a spin-orbit torque device having first, second and third terminals configured such that current between the second and third terminals is capable of changing a resistance between the first and second terminals. In the cell, a first transistor is connected between a logic connection line and the first terminal of the spin-orbit torque device and a second transistor is connected between the logic connection line and the third terminal of the spin-orbit torque device.

22 Claims, 14 Drawing Sheets

(58) Field of Classification Search
USPC .......................................................... 365/158
See application file for complete search history.

(56) References Cited

U.S. PATENT DOCUMENTS

| | | | |
|---|---|---|---|
| 9,224,447 | B2 | 12/2015 | Wang et al. |
| 9,570,140 | B2 | 2/2017 | Di Ventra et al. |
| 10,460,785 | B1 | 10/2019 | Lee et al. |
| 2004/0160809 | A1 | 8/2004 | Lin et al. |
| 2010/0097845 | A1 | 4/2010 | Sakimura et al. |
| 2010/0238719 | A1 | 9/2010 | Nebashi et al. |
| 2011/0069534 | A1 | 3/2011 | Inaba |
| 2019/0304528 | A1 | 10/2019 | Jaiswal et al. |
| 2019/0362765 | A1* | 11/2019 | Park .......................... G11C 8/08 |
| 2020/0075099 | A1* | 3/2020 | Choi ................... G11C 11/1675 |

OTHER PUBLICATIONS

Ajay et al., Accurate and comprehensive sequencing of personal genomes, Genome Research, vol. 21, No. 9, pp. 1498-1505, 2011.

Allwood et al., Magnetic domain-wall logic, Review, Science, vol. 309, pp. 1688-1692, 2005.

Angizi et al., RIMPA: A new reconfigurable dual-mode in-memory processing architecture with spin hall effect-driven domain wall motion device, IEEE Computer Society Annual Symposium on VLSI, pp. 45-50, 2017.

JCI, Machine Learning Repository, https://archive.ics.uci.edu/ml/datasets/human+activity+recognition+using+smartphones, 2 pages, accessed Mar. 10, 2021.

Augustine et al., Low-power functionality enhanced computation architecture using spin-based devices, IEEE/ACM International Symposium on Nanoscale Architectures, pp. 130-136, 2011.

Balsamo et al., Hibernus: Sustaining computation during intermittent supply for energy-harvesting systems. IEEE Embedded Systems Letters, 7(1):15-18, 2014.

Balsamo et al., Hibernus++: a self-calibrating and adaptive system for transiently-powered embedded devices. IEEE Transactions on Computer-Aided Design of Integrated Circuits and Systems, 35(12):1968-1980, 2016.

Behin-Aein, Proposal for an all-spin logic device with built-in memory, Letters, nature Nanotechnology, pp. 266-270, 2010.

Borghetti et al., 'Memristive' switches enable 'stateful' logic operations via material implication, Nature, vol. 464, pp. 873-876, 2010.

Chowdhury et al., Efficient in-memory processing using spintronics, Computer Architecture Letters, vol. 17, No. 1, 4 pages, 2018.

Chowdhury et al., Spintronic in-memory pattern matching, IEEE Journal on Exploratory Solid-State Computational Device and Circuits, vol. 5, No. 2, pp. 206-214, 2019.

Coni, XNOR neural engine: a hardware accelerator IP for 21.6 fJ/op binary neural network interference, IEEE Transactions on Computer-Aided Design of Integrated Circuits and Systems, 12 pages, 2018.

Cowburn et al., Room temperature magnetic quantum cellular automata, Science Reports, vol. 287, pp. 1466-1468, 2000.

Diao et al., Spin transfer switching in dual MgO magnetic tunnel junctions, Applied Physics Letters, vol. 90, 4 pages, 2007.

Dong et al., NVSim: A circuit-level performance, energy, and area model for emerging nonvolatile memory, IEEE Transactions on Computer-Aided Design of Integrated Circuits and Systems, vol. 31, No. 7, pp. 994-1007, 2012.

Durrenfeld et al., Tunable damping, saturation magnetization, and exchange stiffness of half-Heusler NiMnSb thin films, Physical Review B, vol. 92, No. 21, 7 pages, 2015.

Eckert et al., Neural cache: bit-serial in-cache acceleration of deep neural networks, 45th ACM/IEEE International Symposium on Computer Architecture, 14 pages, 2018.

Everspin Technologies, https://www.everspin.com/, 38 pages, 2018.

Franzon et al., FreePDK—NCSU EDA Wiki available at http://eda.ncsu.edu/wiki/freepdk, 1 page, 2008.

Gallagher et al., Development of the magnetic tunnel junction MRAM and IBM: From first junctions to a 16-Mb MRAM demonstrator chip, IBM Journal of Research and Development, vol. 50, No. 1, 20 pages, 2006.

Gao et al., DRAF: a low-power DRAM-based reconfigurable acceleration fabric, ISCA, 13 pages, 2016.

Garello et al., SOT-MRAM 300mm integration for low power and ultrafast embedded memories, IEEE Symp. on VLSI Circuits, 6 pages, 2018.

Harms et al., SPICE macromodel of spin-torque-transfer-operated magnetic tunnel junctions, IEEE Transactions on Electron Devices, vol. 57, No. 6, pp. 1425-1430, 2010.

Hu et al., STT-MRAM with double magnetic tunnel junctions, IEEE International Electron Devices Meeting (IEDM), 4 pages, 2015.

Ikeda et al., A perpendicular-anisotropy CoFeB—MgO magnetic tunnel junction, Letters, Nature Materials, vol. 9, pp. 721-724, 2010.

Illumina sequencing by synthesis (SBS) technology: https://www.illumina.com/technology/next-generation-sequencing/sequencing-technology.html, 3 pages, 2021.

Imre et al., Majority logic gate for magnetic quantum-dot cellular automata, Reports, Science, vol. 311, pp. 205-208, 2006.

Jain et al., Computing in memory with spin-transfer torque magnetic RAM, IEEE Transactions on Very Large Scale Integration (VLSI) Systems, vol. 26, No. 3, pp. 470-483, Mar. 2018.

Jain et al., Computing-in-memory with spintronics, Design, Automation & Test in Europe Conference & Exhibition, pp. 1652-1657, 2018.

Jan et al., Demonstration of fully functional 8Mb perpendicular STT-MRAM chips with sub-5ns writing for non-volatile embedded memories, Symposium on VLSI Technology Digest of Technical Papers, 2 pages, 2014.

Kaplan et al., RASSA: Resistive Accelerator for Approximate Long Read DNA Mapping, Theme Article, arXiv preprint arXiv:1809.01127, 2018.

Kautz, Cellular logic-in-memory arrays, IEEE Transactions on Computers, vol. C-18, No. 8, pp. 719-727, 1969.

Kim et al., GRIM-Filter: Fast seed location filtering in DNA read mapping using processing-in-memory technologies, BMC Genomics, vol. 19, No. 2, 13 pages, 2018.

Kinoshita et al., Bias polarity dependent data retention of resistive random access memory consisting of binary transition metal oxide, Applied Physics Letters, vol. 89, 4 pages, 2006.

Klus et al., BarraCUDA—a fast short read sequence aligner using graphics processing units, BMC Research Notes, vol. 5, No. 27, 7 pages, 2012.

Lavrijsen et al., Magnetic ratchet for three-dimensional spintronic memory and logic, Letter, Nature, vol. 493, pp. 647-650, 2013.

Li et al., Pinatubo: A processing-in-memory architecture for bulk bitwise operations in emerging non-volatile memories, In Proceedings of the 53rd Annual Design Automation Conference, 6 pages, AMC, 2016.

Li et al., DRISA: A DRAM-based reconfigurable in-situ accelerator, in Proceedings of the 50th Annual IEEE/ACM International Symposium on Microarchitecture, ACM, pp. 288-301, 2017.

Liang et al., Performance characterization and majority gate design for MESO-based circuits, IEEE Journal of Exploratory Solid-State Computational Devices and Circuits, 10 pages, 2018.

Lin et al., 45nm low power CMOS logic compatible embedded STT MRAM utilitizing a reverse-connection 1T/1MTJ Cell, IEEE International Electron Devices Meeting (IEDM) 1-4, 2009, doi:10.1109/IEDM.2009.5424368, 2009.

Liu et al., Power consumption estimation in CMOS VLSI chips, IEEE Journal of Solid-State Circuits, vol. 29, No. 6, pp. 663-670, 1994.

Loh et al., A processing-in-memory taxonomy and a case for studying fixed-function PIM, in Workshop on Near-Data Processing in conjunction with MICRO, 4 pages, 2013.

Lyle et al., Direction communication between magnetic tunnel junctions for nonvolatile logic fan-out architecture, Applied Physics Letters, vol. 97, No. 152504, 4 pages, 2010.

Lyle et al., Magnetic tunnel junction logic architecture for realization of simultaneous computation and communication, IEEE Transactions on Magnetics, vol. 47, No. 10, pp. 2970-2973, 2011.

(56) References Cited

OTHER PUBLICATIONS

Ma et al., Incidental Computing on IoT nonvolatile processors, IEEE/ACM International Symposium on Microarchitecture (MICRO), pp. 204-218, 2017.

Maehara et al., Tunnel Magnetoresistance above 170% and Resistance-Area Product of Ω(μm)2 Attained by In situ Annealing of Ultra-Thin MgO Tunnel Barrier, Applied Physics Express 4, pp. 033002-1-033002-3, 2011.

Matsunaga et al., Fabrication of a nonvolatile full adder based on logic-in-memory architecture using magnetic tunnel junctions, Applied Physics Express 1, pp. 091301-1-091301-3, 2008.

Meng et al., A spintronic full adder for magnetic CPU, IEEE Electron Device Letters, vol. 26, No. 6, pp. 360-362, 2005.

Mizukami et al., Low damping constant for Co2FeAl Heusler alloy films and its correlation with density of states, Journal of Applied Physics, vol. 105, pp. 07D306-1-07D306-3, 2009.

Ney et al., Programmable computing with a single magnetoresistive element, Letters to Nature, Nature, vol. 425, pp. 485-487, 2003.

Noguchi et al., 7.5 A 3.3ns-access-time 71.2 μW/MHz 1Mb embedded STT-MRAM using physically eliminated read-disturb scheme and normally-off memory architecture,IEEE International Solid-State Circuits Conference (ISSCC), 3 pages, 2015.

Oboril et al., Evaluation of hybrid memory technologies using SOT-MRAM for on-chip cache hierarchy, IEEE TCAD, vol. 34, No. 3, 14 pages, 2015.

Parkin et al., Magnetic domain-wall racetrack memory, Science, vol. 320, pp. 190-194, 2008.

Parveen et al., IMFlexCom: Energy efficient in-memory flexible computing using dual-mode SOT-MRAM, ACM Journal on Emerging Technologies in Computing Systems, vol. 14, No. 3, Article 35, 18 pages, 2018.

Patil et al., Spintronic Logic Gates for Spintronic Data Using Magnetic Tunnel Junctions, IEEE International Conference on Computer Design, pp. 125-131, doi:10.1109/ICCD.2010-5647611, 2010.

Resch et al., PIMBALL: Binary neural networks in spintronic memory, ACM Transactions on Architecture and Code Optimization, vol. 16, No. 4, Article 41, 26 pages, 2019.

Saida et al., Sub-3 ns pulse with sub-100 μA switching of 1x-2x nm perpendicular MTJ for high-performance embedded STT-MRAM towards sub-20 nm CMOS, IEEE Symposium on VLSI Technology, pp. 1-2. IEEE, 2016.

Saraswat et al., Effect of scaling of interconnections on the time delay of VLSI circuits, IEEE Journal of Solid-State Circuits, vol. SC-17, No. 2, pp. 275-280, 1982.

Sato et al., Properties of magnetic tunnel junctions with a MgO/CoFeB/Ta/CoFeB/MgO recording structure down to junction diameter of 11nm, Applied Physics Letters, vol. 105, 5 pages, 2014.

Seshadri et al., Ambit: In-memory accelerator for bulk bitwise operations using commodity DRAM technology, in Proceedings of the 50th Annual IEEE/ACM International Symposium on Microarchitecture, ser. MICRO-50 '17. New York, NY, USA: ACM, pp. 273-287, 2017.

Strukov et al., The missing memristor found, Nature, Letters, vol. 453, pp. 80-83, 2008.

Su et al., A 462gops/j rram-based nonvolatile intelligent processor for energy harvesting ioe system featuring nonvolatile logics and processing-in-memory. Symposium on VLSI Technology, pp. T260-T261. IEEE, 2017.

Sun et al., Fully parallel rram synaptic array for implementing binary neural network with (+1,−1) weights and (+1, 0) neurons. In Proceedings of the 23rd Asia and South Pacific Design Automation Conference, pp. 574-579. IEEE Press, 2018.

Tang et al., Binary convolutional neural network on RRAM, Design Automation Conference (ASP-DAC), 2017 22nd Asia and South Pacific, pp. 782-787. IEEE, 2017.

Varga et al., Non-volatile and reprogrammable MQCA-based majority gates, Device Research Conference, 2 pages, 2009.

Walus et al., Circuit design based on majority gates for applications with quantum-dot cellular automata, IEEE 0-7803-8622-1, pp. 1354-1357, 2005.

Wang et al., Programmable spintronics logic device based on a magnetic tunnel junction element, Journal of Applied Physics, vol. 97, 4 pages, 2005.

Wang et al., Magnetic tunnel junction based integrated logics and computational circuits, Nanomagnetic and Spintronic Devices for Energy-Efficient Memory and Computing, Chapter 5, pp. 133-164, 2015.

Wang et al, INVITED: A pathway to enable exponential scaling for the beyond-CMOS era, ACM, 6 pages, 2017.

Wang, Computational random access memory (CRAM) and applications, 1 page, 2019.

Wolf et al., The promise of nanomagnetics and spintronics for future logic and universal memory, Proceedings of the IEEE, Invited Paper, vol. 98, No. 12, pp. 2155-2168, 2010.

Xia et al., Memristor-CMOS Hybrid Integrated Circuits for Reconfgurable Logic, Nano Letters vol. 1, pp. 3640-3645, 2009.

Xia et al., Switched by input: power efficient structure for rram-based convolutional neural network, In Proceedings of the 53rd Annual Design Automation Conference, p. 125. ACM, 2016.

Yao et al., Magnetic tunnel junction-based spintronic logic units operated by spin transfer torque, IEEE Transactions on Nonotechnology, vol. 11, No. 1, pp. 120-126, 2012.

Yu et al., Binary neural network with 16 Mb RRAM macro chip for classification and online training, In Electron Devices Meeting (IEDM), 2016 IEEE International, pp. 16-2. IEEE, 2016.

Yuasa et al., Giant tunneling magnetoresistance up to 410% at room temperature in fully epitaxial Co Mg O Co magnetic tunnel junctions with bcc Co(001) electrodes, Applied Physics Letters vol. 89, 042505, 4 pages, 2006.

Zabihi et al., In-memory processing on the spintronic CRAM: From hardware design to application mapping, IEEE Transactions on Computers, 14 pages, 2018.

Zabihi et al., True in-memory computing with the CRAM: From technology to applications, Special Session 1: In-memory processing for future electronics, 1 page, 2019.

Zabihi et al., Using spin-hall MTJs to build an energy-efficient in-memory computation platform, in 20th International Symposium on Quality Electronic Design (ISQED), pp. 52-57, 2019.

Zhu, Magnetoresistive Random Access Memory: The Path to Competitiveness and Scalability, Proceedings of the IEEE, vol. 96, No. 11, pp. 1786-1798, 2008.

\* cited by examiner

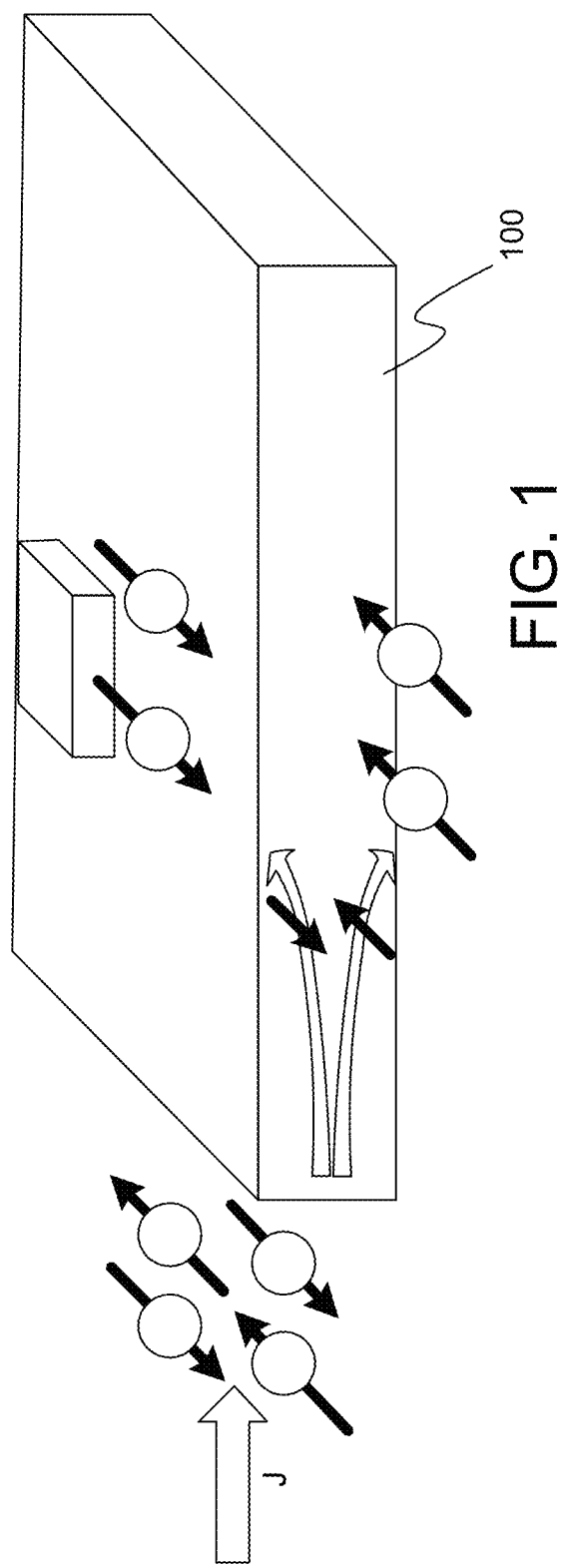

FIG. 6(a)
FIG. 6(b)
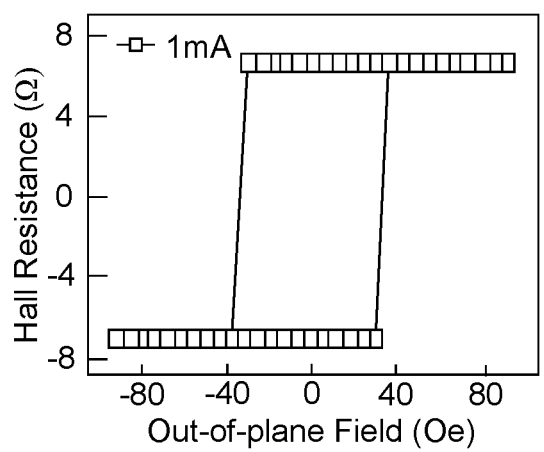
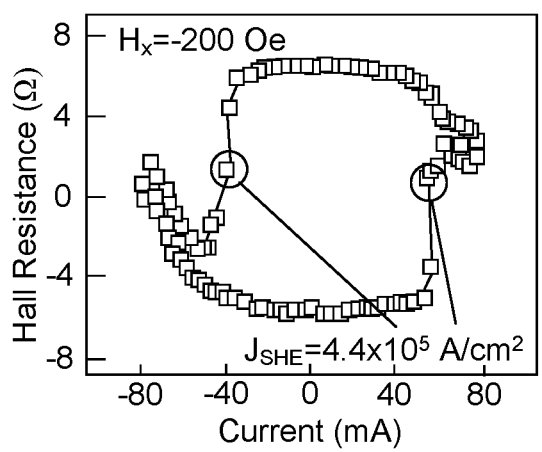

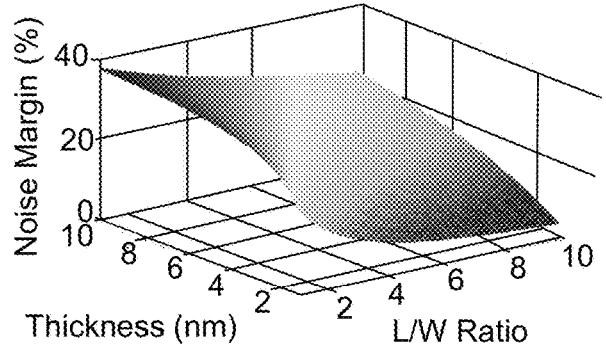
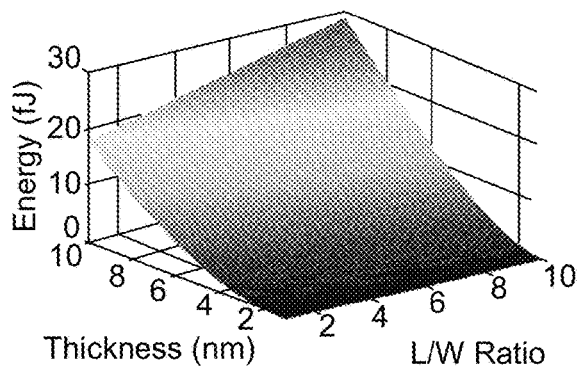
FIG. 9(a)          FIG. 9(b)
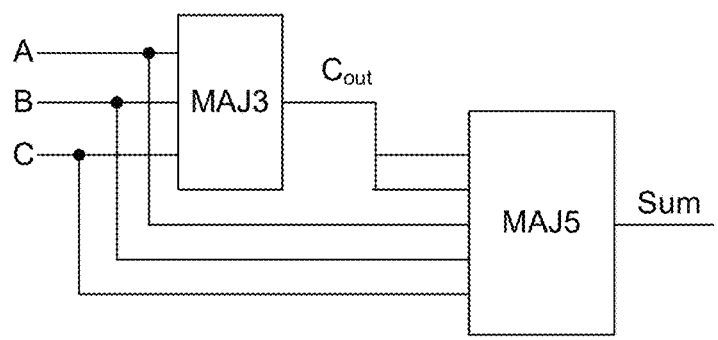
FIG. 10(prior art)

○ BUFFER
⊗ /MAJ3
● /MAJ5
⊘ PRESET

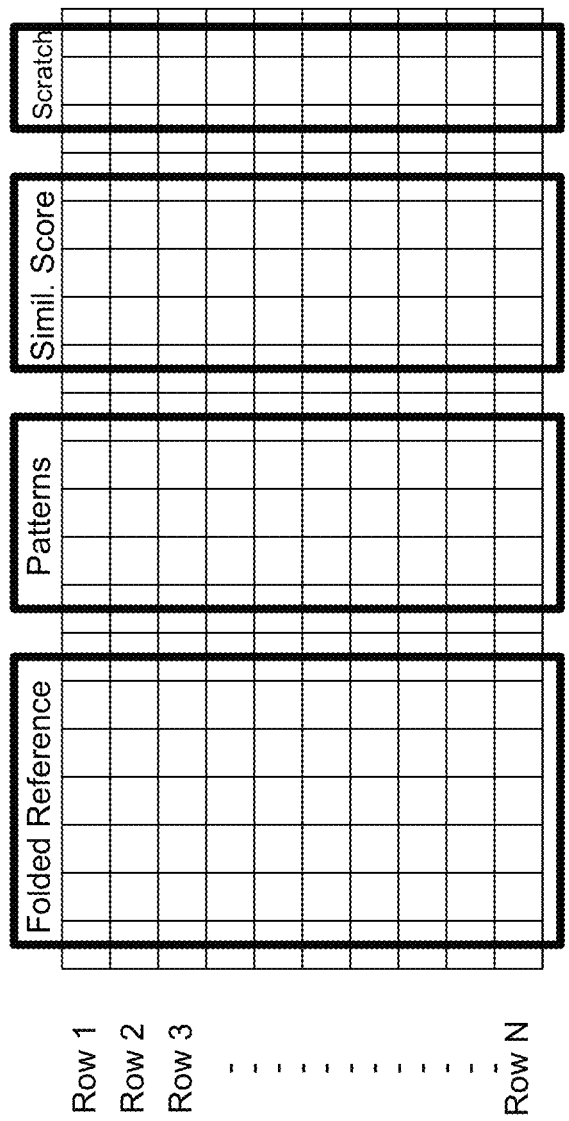

COMPUTATIONAL RANDOM ACCESS MEMORY (CRAM) BASED ON SPIN-ORBIT TORQUE DEVICES

CROSS-REFERENCE TO RELATED APPLICATIONS

The present application is based on and claims the benefit of U.S. provisional patent application Ser. No. 62/811,915, filed Feb. 28, 2019, the content of which is hereby incorporated by reference in its entirety.

This invention was made with government support under CCF-1725420 awarded by the National Science Foundation. The government has certain rights in the invention.

BACKGROUND

In traditional computing systems, a central processing unit retrieves data from a memory, performs an instruction on the data to produce a result and returns the result to memory for storage. Thus, data must be transferred along a bus each time an instruction is executed.

The discussion above is merely provided for general background information and is not intended to be used as an aid in determining the scope of the claimed subject matter. The claimed subject matter is not limited to implementations that solve any or all disadvantages noted in the background.

SUMMARY

A logic-memory cell includes a spin-Hall device having first, second and third terminals configured such that current between the second and third terminals is capable of changing a resistance between the first and second terminals. In the cell, a first transistor is connected between a logic connection line and the first terminal of the spin-Hall device and a second transistor is connected between the logic connection line and the third terminal of the spin-Hall device.

In accordance with a further embodiment, a cell array includes a plurality of cells, a logic connection line connected to each cell in the plurality of cells, a plurality of write lines, each write line connected to a respective cell in the plurality of cells and a plurality of read lines, each read line connected to a respective cell in the plurality of cells. During a logic operation, at least one of the plurality of read lines is used to connect at least one respective cell of the plurality of cells to the logic connection line to provide at least one respective input value for the logic operation and one of the plurality of write lines is used to connect a respective cell of the plurality of cells to the logic connection line to produce and store an output value for the logic operation.

In accordance with a still further embodiment, a method includes setting a read line of a first cell and a write line of a second cell to cause current to pass through a magnetic tunnel junction of the first cell, through a logic connection line connecting the first cell and the second cell and through a spin-orbit torque channel of the second cell so as to execute a logic operation and store an output of the logic operation in the second cell.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 is a simplified diagram showing the spin-Hall effect.

FIG. 6(a) provides a graph showing the hysteresis of Hall resistance for the two magnetic states of a Hall bar device.

FIG. 6(b) provides a graph of Hall resistance as a function of switching current in a Hall bar device.

FIG. 9(a) is a graph showing the relationship between SHM geometry and noise margin.

FIG. 9(b) is a graph showing the relationship between SHE geometry and energy.

FIG. 10 is a diagram of a Full Adder based on majority logic, where $C_{out}$=MAJ3 (A, B, C) and Sum=MAJ5(A, B, C, $C_{out}$, $C_{out}$).

FIG. 17 provides a data layout for a SOT-CRAM array executing large-scale pattern matching.

DETAILED DESCRIPTION

1. Introduction

Figure 2A:
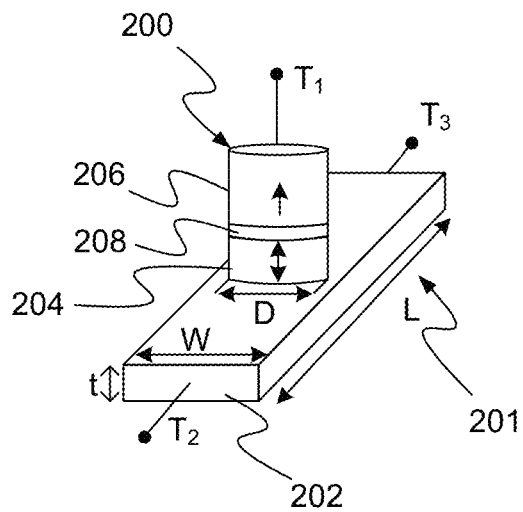
FIG. 2(a) is a schematic diagram of a 3-terminal SOT-MTJ in accordance with one embodiment.

Trends in the computational structure and data footprint of emerging applications prompt the need for a significant departure from traditional CPU-centric computing [S. W. Keckler, et al., "GPUs and the future of parallel computing," *IEEE Micro*, vol. 31, pp. 7-17, 11 2011]. First, in the big data era, the cost (in terms of energy and latency) of transporting data from memory to the processor is prohibitive. Communication energy dominates computation energy; even the cleverest latency-hiding techniques cannot conceal their overhead. Second, since general-purpose processors are inefficient for emerging applications, there is a trend towards specialized accelerators, tailored for efficient execution of specific classes of applications. However, even these structures can suffer from memory bottlenecks.

An effective way to overcome these bottlenecks is to embed compute capability into the main memory, allowing distributed processing of data at the source and obviating the need for intensive energy-hungry communication, through true in-memory computing uses the memory array to perform computations through simple reconfigurations.
 near-memory computing places computational units at the periphery of memory for fast data access [J. T. Pawlowski, "Hybrid memory cube (HMC)," in Proceedings of the IEEE Hot Chips Symposium, 2011; J. Macri, "AMD's next generation GPU and high bandwidth memory architecture: FURY," in Proceedings of the IEEE Hot Chips Symposium, 2015].

Post-CMOS technologies open the door to new architectures for in-memory computation. The Computational Random Access Memory (CRAM) architecture [J.-P. Wang and J. D. Harms, "General structure for computational random access memory (CRAM)," U.S. Pat. No. 9,224,447 B2, Dec. 29 2015; Z. Chowdhury, et al., "Efficient in-memory processing using spintronics," IEEE Computer Architecture Letters, vol. 17, pp. 42-46, 2017; M. Zabihi, et al., "In-memory processing on the spintronic CRAM: From hardware design to application mapping," IEEE Transactions on Computers, Vol. 68, No. 8, pp. 1159-1173, August 2019] is a true in-memory computing substrate where a memory array is dynamically reconfigured to perform computations. This architecture has been illustrated on the spin transfer torque (STT) magnetic tunnel junction (MTJ): individual MTJs are relatively slow and power-hungry compared to CMOS-based devices, but these drawbacks are compensated by their ability to perform true in-memory processing, which leads to large savings in communication energy to the periphery of the array or beyond, which more than "pay for" STT-MTJ drawbacks.

To improve CRAM efficiency, embodiments use a 3-terminal MTJ, whose write mechanism is based on Spin-Orbit Torque such as the spin-Hall effect (SHE). As shown in FIG. 1, the spin-Hall effect can be observed by passing a charge current (J) through a non-magnetic material 100 that serves as a spin Hall channel. Due to spin-orbit coupling (SOC), electrons of different spin directions are deflected in opposite directions, i.e. electrons with downward spin are pushed toward the top surface and electrons with upward spin are deflected toward the bottom surface. This deflection results in the generation of aligned spins (spin accumulation) at the interfaces which in turn exert a torque on a neighboring magnetic layer, resulting in a change in the magnetic orientation of the magnetic layer. In the discussion below, spin-Hall effect (SHE) is referenced but the embodiments described below may be implemented using any Spin-Orbit Torque (SOT) system that changes the resistance of the MTJ using a current that does not pass through the MTJ. Examples of other SOT systems include those that rely on the Rashba Edelstein effect, TI surface states, spin galvanic, etc.

The SOT-MTJ delivers improved speed and energy-efficiency over the traditional 2-terminal STT-MTJ [C. Zhang, et al., "Spin-orbit torque induced magnetization switching in nano-scale Ta/CoFeB/MgO," *Applied Physics Letters*, vol 107, 012401, 2015], and recent research on novel spin-Hall materials, e.g., sputtered $BiSe_x$ [Mahendra D. C. et al., "Room-temperature high sping-orbit torque due to quantum confinement in sputtered $Bi_xSe_{(1-x)}$ films," *Nature Materials*, vol. 17, pp. 800-807, 2018], which experimentally demonstrates very high spin-Hall angles, will lead to further gains over today's SOT-MTJs. Moreover, the separation of write and read paths in the 3-terminal SOT-MTJ makes this device more reliable than the STT-MTJ [G. Prenat, et al., "Ultrafast and high-reliability SOT-MRAM: From cache replacement to normally-off computing," *IEEE Transactions on Multi-Scale Computing Systems*, vol. 2, pp. 49-60, 2016].

However, due to differences between the SOT-MTJ and the STT-MTJ (e.g., in the number of terminals and in the operation mechanism), building a SOT-CRAM is more complex than simply replacing STT-MTJs in the STT-CRAM with SOT-MTJs. In this work, we show how the STT-CRAM architecture must be altered for SOT-MTJs, and that these changes require alterations to operation scheduling schemes. We describe a double-write-line array structure for the SOT-CRAM, and present new data placement and scheduling methods for the implementation of computational blocks in the SOT-CRAM. By evaluating computations on representative applications, we show that, in comparison with the STT-based CRAM, the SOT-CRAM demonstrates an overall improvement in latency and energy.

2. SOT-CRAM Structure

The structure of 3-terminal SOT-MTJ 201 in accordance with one embodiment is shown in FIG. 2(*a*). It is composed of a conventional perpendicular MTJ (pMTJ) stack 200 seated on a spin-orbit torque (SOT) channel 202, with an externally applied magnetic field. MTJ stack 200 includes a fixed magnetic layer 206 at the top of stack 200, a tunnel barrier 208 below fixed magnetic layer 206 and a free magnetic layer 204 below tunnel barrier 208, where the free magnetic layer 204 sits directly on SOT channel 202. A first terminal T1 is connected to the top of stack 200, a second terminal T2 is connected to one end of SOT channel 202 and a third terminal T3 is connected to the other end of SOT channel 202.

SOT-MTJ 201 is generally kept in one of two resistance states referred to as parallel (RP, logic '0') and anti-parallel (RAP, '1'). In the parallel resistance state, the orientation of the magnetic moment of free magnetic layer 204 is in the same direction as the magnetic moment of fixed magnetic layer 206. In the anti-parallel resistance state, the orientation of the magnetic moment of free magnetic layer 204 is in an opposite direction to the magnetic moment of fixed magnetic layer 206.

When SOT-MTJ 201 is in the anti-parallel state, it has a greater resistance for current flows across tunnel barrier 208 than when SOT-MTJ 201 is in the parallel state. As a result, the resistance state of SOT-MTJ 201 can be determined by passing a current between terminals T1 and T3 and measuring the resulting voltage across terminals T1 and T3 or alternatively, applying a voltage across terminals T1 and T3 and measuring the resulting current. Since the resistance state represents the logic state of SOT-MTJ 201, the logic state of SOT-MTJ 201 can be read by applying a current/voltage to T1 and T3 and measuring the resulting voltage/current across T1 and T3.

The orientation of the magnetic moment of free magnetic layer 204 can be switched by passing current through SOT channel 202 (between T2 and T3 in FIG. 2(a)). In particular, passing current that exceeds a threshold current density $J_{SOT}$ in a first direction through SOT channel 202 will set the orientation of the magnetic moment of free magnetic layer 204 in a first direction while passing current that exceeds the threshold current density in a second direction through SOT channel 202 sets the orientation of the magnetic moment of free magnetic layer 204 in an opposite direction. [L. Liu, et al., "Spin-torque switching with the giant spin Hall effect of tantalum," *Science*, vol. 336, Issue 6081, pp. 555-558, 2012]. Thus, a logic value can be written to SOT-MTJ 201 by passing a current of the appropriate current density and direction between T2 and T3.

Once the orientation of the magnetic moment of free magnetic layer 204 is set, it will remain until a write current of appropriate current density and direction is applied between T2 and T3. This means that the logic value of SOT-MTJ 201 is non-volatile and will persist when power is removed from SOT-MTJ 201. In addition, the logic value of SOT-MTJ 201 does not change when the logic value is read. Thus, read operations are non-destructive.

Figure 2B:
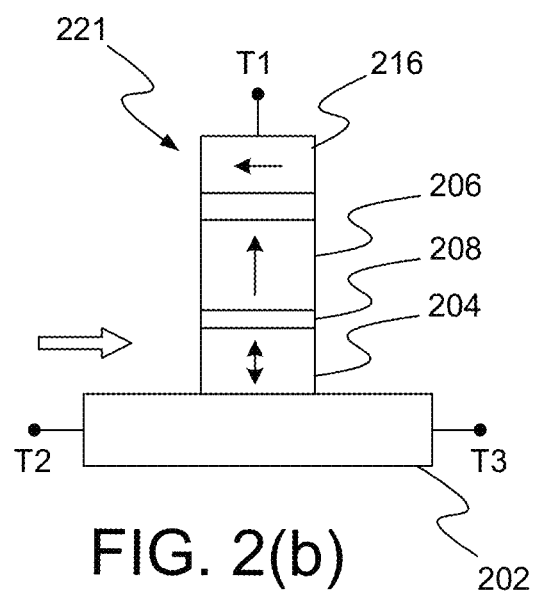
FIG. 2(b) is a schematic diagram of a 3-terminal SOT-MTJ in accordance with a second embodiment.

In an alternative embodiment, the external magnetic field can be removed by adding an in-plane biasing layer 216 to the MTJ as shown in the SOT-MTJ 221 of FIG. 2(b).

Figure 3:
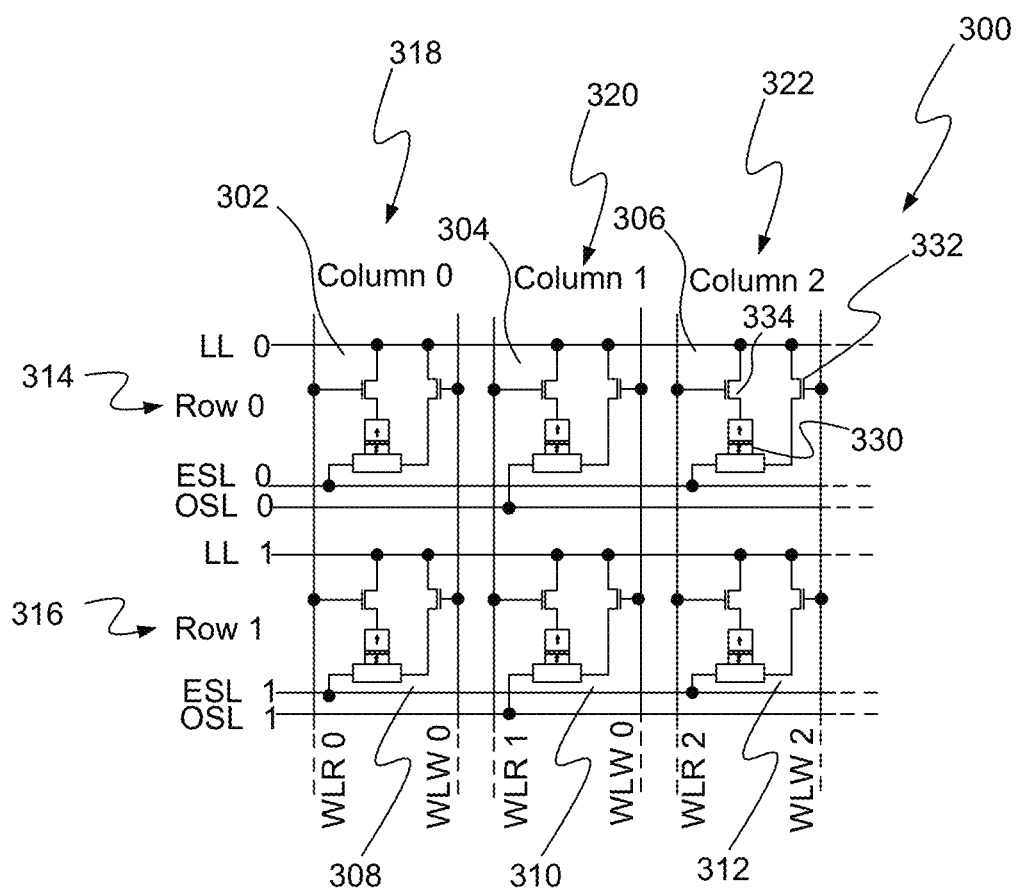
FIG. 3. is a schematic diagram of the overall structure of a SOT-CRAM.

FIG. 3 shows the architecture of a portion of a SOT-CRAM array 300, which can operate in memory or logic mode. The portion of SOT-CRAM array 300 shown in FIG. 3 shows six cells 302, 304, 306, 308, 310 and 312 organized into two rows 314 and 316 and three columns 318, 320 and 322. At the bitcell level, this structure is quite different from the STT-CRAM. As exemplified by cell 306, each cell contains a SOT-MTJ 330, which is structured either like SOT-MTJ 201 of FIG. 2(a) or like SOT-MTJ 221 of FIG. 2(b). Each cell also contains a write transistor 332 that is connected to terminal T2 of the SOT channel and controls when a write current is applied to SOT-MTJ 330. Each cell also includes a read transistor 334 that is connected to terminal T1 of the MTJ and controls when a read current passes through SOT-MTJ 330.

Each row has two select lines (SLs), ESL and OSL—which are connected to the terminal T3 of the SOT Channel, with the ESL being connected to the SOT channels of the cells in the even columns and the OSL being connected to the SOT channels of the cells in the odd columns. Each row also has a logic line (LL) that connects to the read and write transistors of each cell in the row. Each column has a read and write word line (WLR, WLW) with the read word line being connected to the gates of each read transistor in the column and the write word line being connected to the gates of each write transistor in the column. At the array level, the arrangement of wires must accommodate the connections required by the 3-terminal SOT-MTJ. Conventionally, the word line in a memory is drawn as a horizontal line, but we show a rotated array where the word lines run vertically. We make this choice for convenience so that we can compactly show the sequence of computations in later figures.

Figure 4A:
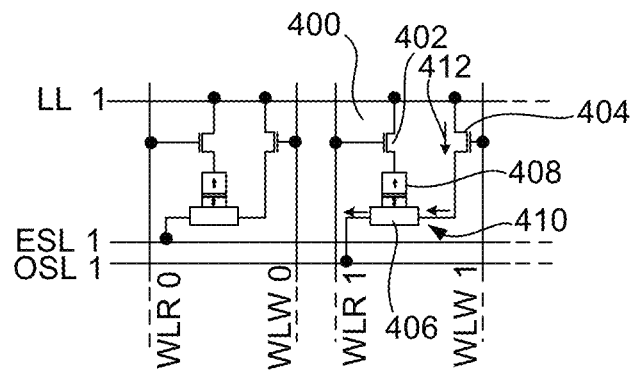
FIG. 4(a) is a schematic diagram showing current flow during memory write operation.

FIG. 4(a) shows a SOT-CRAM cell 400 in a memory write mode during which a logic value is written to SOT-MTJ 410. In memory write mode, read word line WLR1 is low causing read transistor 402 of cell 400 to be off. This disconnects terminal T1 of MTJ 408 from logic line LL1. At the same time, write word line WLW1 is high, turning on the write transistor 404 of cell 404 and thereby connecting terminal T2 of SOT channel 406 to logic line LL1. Terminal T3 of SOT channel 406 is permanently connected to select line OSL1. A voltage is then applied between LL1 and OSL1 to cause a current 412 to flow in a desired direction through SOT channel 410 to write the desired logic value to MTJ 408.

Figure 4B:
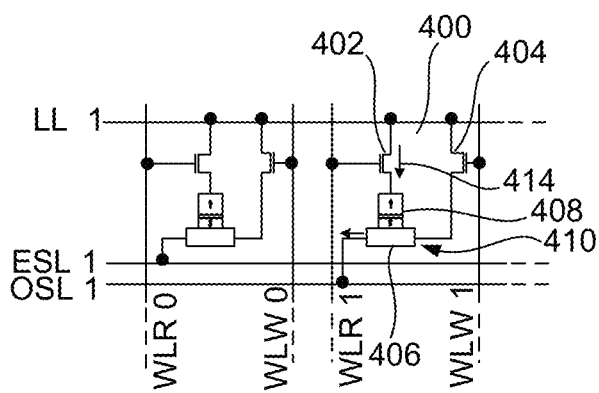
FIG. 4(b) is a schematic diagram showing current flow during memory read operation.

FIG. 4(b) shows SOT-CRAM cell 400 in a read mode during which a logic value is read from SOT-MTJ 410. In read mode, write word line WLW1 is low, causing write transistor 404 to be off. This disconnects terminal T2 of SOT channel 406 from logic line LL1. At the same time, read word line WLR1 is high, turning on read transistor 402 to thereby connect logic line LL1 to terminal T1 of MTJ 408. A current/voltage is then applied between logic line LL1 and select line OSL1 and the corresponding voltage/current is measured to sense the resistance between logic line LL1 and select line OSL1 and thus the logic state of MTJ 408.

Figure 4C:
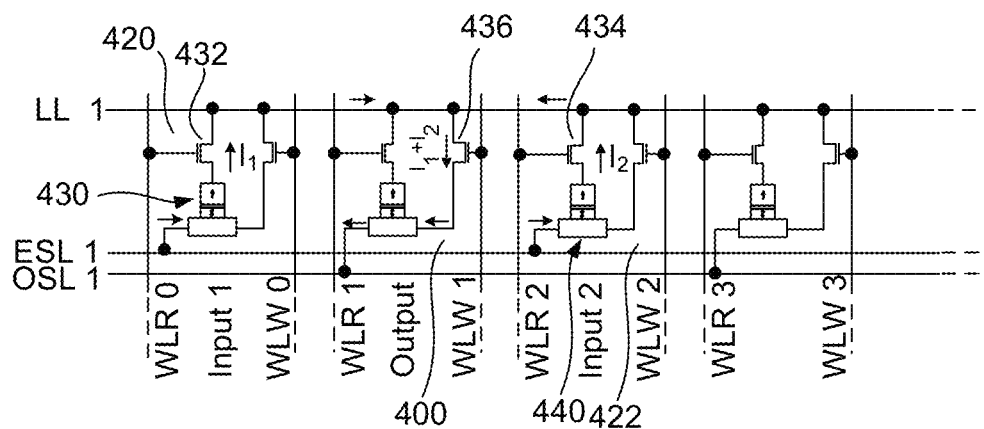
FIG. 4(c) is a schematic diagram showing current flow during logic mode.

FIG. 4(c) shows three SOT-CRAM cells 420, 400 and 422 connected together in a logic mode. Cells 420 and 422 provide inputs to the logic operation and cell 400 determines and stores the output of the logic operation. In FIG. 4(c) read word line WLR0 and read word line WLR1 are both high, causing read transistor 432 of cell 420 and read transistor 434 of cell 422 to be on. This connects terminal T1 of both SOT-MTJ 430 and SOT-MTJ 440 to logic line LL1, which is floating. Write word line WLW1 is also set to high causing write transistor 426 of cell 400 to be on, thereby connecting terminal T2 of SOT channel 406 to logic line LL1. The voltage on select lines OSL1 and ESL1 are then set so that current flows through the MTJ's of both SOT-MTJ 430 and SOT-MTJ 434 and both of those currents flow through SOT channel 406 of SOT-MTJ 410.

Figure 5A:
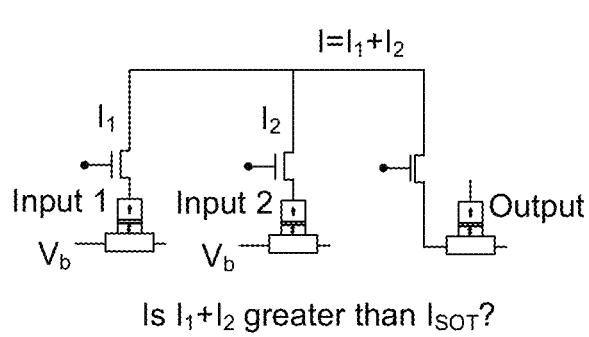
FIG. 5(a) is a schematic diagram of active elements performing a logic operation in a row of SOT-CRAM.
Figure 5B:
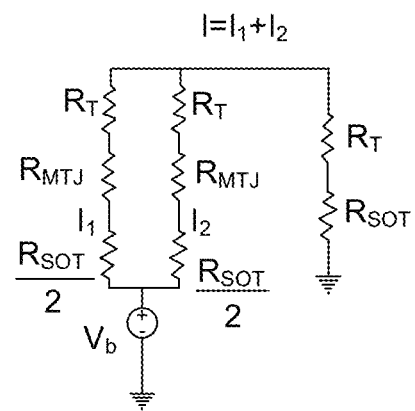
FIG. 5(b) is the equivalent circuit model for the schematic diagram of FIG. 5(a).

FIG. 5(a) isolates the part of the array involved in a logic operation with two inputs, and shows its equivalent circuit in FIG. 5(b), where the resistor values depend on the state variables (MTJ resistances) and transistor resistances. Before the computation starts, the output MTJ is initialized to a preset value. By applying bias voltage $V_b$ across the input and output cell SLs, current $I_1+I_2$ flows through the SOT channel of the output, where the magnitude of each current depends on the input MTJ state (i.e., resistance). If $I_1+I_2>J_{SOT}$, where $J_{SOT}$ is the SOT threshold current, then depending on the current direction, a value is written to the output MTJ state; otherwise, the preset output state remains intact. By appropriately choosing the voltages and output preset, different logic functions can be implemented.

Note that in the logic mode, all input operands must be in even-numbered columns, and the output must be in an odd-numbered column—or vice versa. This is unlike the STT-CRAM, where no such limitation is necessary, and is a consequence of the 3-terminal structure of the SOT-MTJ.

The three modes—memory read/write and logic mode—are summarized in Table 1.

TABLE 1

Status of lines and transistors in the SOT-CRAM during memory and logic modes.

| Operation | | WLW | WLR | Transistor connected to WLW | Transistor connected to WLR | Active ESL | Active OSL | LL |
|---|---|---|---|---|---|---|---|---|
| Memory Mode | Write | High | Low | ON | OFF | Even column | Odd column | Active |
| | Read | Low | High | OFF | ON | Even column | Odd column | Active |
| Logic Mode | Input Cells | Low | High | OFF | ON | Any column | Any column | Float |
| | Output Cells | High | Low | ON | OFF | | | |

3. SOT-CRAM Details

A. Gate-Level Design

In logic mode, the configuration of the SOT-CRAM into various gate types is controlled by two factors: (a) output preset value, (b) bias voltage, $V_b$ (FIG. 5(b)). By modeling the current path of each gate as in FIG. 5(b), we can determine the conditions for implementing each gate type. The voltage $V_b$ applied across the MTJ interconnections in logic mode falls across ESL and OSL. This voltage, applied across $$\left(\frac{R_{SOT}}{2} + R_{MTJ_1} + R_T\right) \| \left(\frac{R_{SOT}}{2} + R_{MTJ_2} + R_T\right)$$

in series with ($R_{SOT}+R_T$), is shown in FIG. 5(b). Here, "$\|$" represents the equivalent resistance of resistors in parallel, $R_{SOT}$ is the resistance across the entire SOT channel, $R_T$ is the resistance across the transistor and $R_{MTJ}$ is the resistance through the entire MTJ. For the configuration in FIG. 5(b), the current I through the logic line is $$I = \frac{V_b}{\left[\left(\frac{R_{SOT}}{2} + R_{MTJ_1} + R_T\right) \| \left(\frac{R_{SOT}}{2} + R_{MTJ_2} + R_T\right)\right] + R_3}, \quad (1)$$

If $V_b$ is too low, $I<I_{SOT}$, and the current is insufficient to switch the output; if it is too high, $I>I_{SOT}$, and the output is switched regardless of the input state.

The resistance of the MTJ may take on one of two values, $R_P$ or $R_{AP}$. For conciseness, we define $R_1$, $R_2$, and $R_3$ as:

$$R_1 = \frac{R_{SOT}}{2} + R_P + R_T \quad (2)$$

$$R_2 = \frac{R_{SOT}}{2} + R_{AP} + R_T \quad (3)$$

$$R_3 = R_{SOT} + R_T \quad (4)$$

Consider the case where the cells in FIG. 5(a) are used to implement a 2-input AND gate. For each of the input states (00 through 11), we can calculate the currents flowing through the SOT channel of the output MTJ as:

$$I_{00} = \frac{V_b}{\frac{R_1}{2} + R_3} \quad (5)$$

-continued $$I_{01} = I_{10} = \frac{V_b}{(R_1 \| R_2) + R_3} \quad (6)$$

$$I_{11} = \frac{V_b}{\frac{R_2}{2} + R_3} \quad (7)$$

For the AND gate the preset output value is 1. For correct AND operation, we must choose $V_b$ appropriately so that $I_{00}>I_{SOT}$ and $I_{01}=I_{10}>I_{SOT}$ (i.e., both cases, the preset output is switched to 0), and $I_{11}<I_{SOT}$ (i.e., the output stays at 1).

Since $R_P<R_{AP}$, $R_1<R_2$. Therefore, from eq. (5)-(7), $$I_{11}<I_{01}=I_{10}<I_{00}. \quad (8)$$

Thus, if we chose $V_b$ to be large enough so that $I_{01}=I_{10}>I_{SOT}$, then $I_{00}>I_{SOT}$ must always be true. From eq. (6), the following constraint must be obeyed.

$$V_b>((R_1\|R_2)+R_3)I_{SOT} \quad (9)$$

However, to ensure the correctness of the 11 input case, $V_b$ cannot be too large. Specifically, from eq. (7), it is required that $I_{11}<I_{SOT}$, which leads to the second constraint, $$V_b < \left(\frac{R_2}{2} + R_3\right)I_{SOT}. \quad (10)$$

These two constraints limit the range of $V_b$ for the AND gate. A NAND gate is identical to the AND, except that a preset value of 0 is used; the range of $V_b$ is identical to the AND.

Similar constraints can be derived for other logic gates, and the bias voltage ranges to implement other gates can be calculated similarly.

B. SHE-CRAM Example

Table 3 summarizes the bias voltage ranges and the preset value for various gate types using the parameters of Table 2 for a spin-Hall effect (SHE) example of a SOT-CRAM (referred to as SHE-CRAM). The dimensions of the SHE-MTJ in Table 2 are appropriately chosen to (a) provide an optimal margin window (see next sections), (b) provide a low $J_{SHE}$, and (c) avoid unwanted STT switching during logic operations.

TABLE 2

SHE-MTJ specifications.

| Parameters | Value |
|---|---|
| MTJ type | CoFeB/MgO p-MTJ |
| Spin Hall channel material | Sputtered BiSe$_x$ |
| MTJ diameter (D) | 10 nm |
| Spin Hall channel length (L) | 30 nm |
| Spin Hall channel width (W) | 15 nm |
| Spin Hall channel thickness (t) | 4 nm |
| Spin Hall channel sheet resistance (R$_{sheet}$) | 32 kΩ |
| Spin Hall channel resistance (R$_{SHE}$) | 64 kΩ |
| MTJ RA product | 20 Ω · μm$^2$ |
| MTJ TMR ratio | 100% |
| MTJ Parallel resistance (R$_P$) | 253.97 kΩ |
| MTJ Anti-Parallel resistance (R$_{AP}$) | 507.94 kΩ |
| STT critical current density (J$_{STT}$) | 5 × 10$^6$ A/cm$^2$ |
| SHE threshold current density (J$_{SHE}$) | 5 × 10$^6$ A/cm$^2$ |
| STT threshold current (I$_{STT}$) | 3.9 μA |
| SHE threshold current (J$_{SHE}$) | 3 μA |
| SHE pulse width (t$_{SHE}$) | 1 ns |
| Transistor Resistance (R$_T$) | 1 kΩ |

TABLE 3

Bias voltage ranges, and output preset value.

| Gate | Preset | Check form formula for bias voltage range | Numerical value (Volt) |
|---|---|---|---|
| NOT | 0 | $(R_1 + R_3)I_{SHE} < V_b < (R_2 + R_3)I_{SHE}$ | 1.065-1.827 |
| Buffer | 1 | | |
| NAND | 0 | $\left(\frac{R_1 R_2}{R_1 + R_2} + R_3\right)I_{SHE} < V_b < \left(\frac{R_2}{2} + R_3\right)I_{SHE}$ | 0.768-1.017 |
| AND | 1 | | |
| NOR | 0 | $\left(\frac{R_1}{2} + R_3\right)I_{SHE} < V_b < \left(\frac{R_1 R_2}{R_1 + R_2} + R_3\right)I_{SHE}$ | 0.636-0.768 |
| OR | 1 | | |
| $\overline{MAJ3}$ | 0 | $\left(\frac{R_1 R_2}{R_1 + 2R_2} + R_3\right)I_{SHE} < V_b < \left(\frac{R_1 R_2}{2R_1 + R_2} + R_3\right)I_{SHE}$ | 0.546-0.624 |
| MAJ3 | 1 | | |
| $\overline{MAJ5}$ | 0 | $\left(\frac{R_1 R_2}{2R_1 + 3R_2} + R_3\right)I_{SHE} < V_b < \left(\frac{R_1 R_2}{3R_1 + 2R_2} + R_3\right)I_{SHE}$ | 0.418-0.446 |
| MAJ5 | 1 | | |

For our evaluation, the novel sputtered BiSe$_x$ is used as the SH channel, due to its high spin-Hall efficiency [Mahendra D. C. et al., "Room-temperature high sping-orbit torque due to quantum confinement in sputtered Bi$_x$Se$_{(1-x)}$ films," *Nature Materials*, vol. 17, pp. 800-807, 2018]. FIG. 6(a) demonstrates the SHE switching of such a structure which requires a very low switching current density. The device is a micron-size Hall bar, which is composed of BiSe$_x$ (5 nm)/Ta (0.5 nm) as the SH channel and CoFeB (0.6 nm)/Gd (1.2 nm)/CoFeB(1.1 nm) as the magnetic layer. The easy-axis of the magnetic layer is along the out-of-plane direction. Two magnetization states (up or down, corresponding to the positive or negative Hall resistance) are revealed from the loop in FIG. 6(a). The magnetization can be switched between the two states by injecting a current through the SH channel, as shown in FIG. 6(b). The threshold switching current density J$_{SHE}$ is determined to be 4.4×10$^5$ A/cm$^2$, which is two orders lower than normal spin-Hall structures with metal like Ta, W, or Pt as the SH channel. In Table 2, J$_{SHE}$ is set to 5×10$^6$ A/cm$^2$, based on [C. Zhang, et al., "Spin-orbit torque induced magnetization switching in nano-scale Ta/CoFeB/MgO," *Applied Physics Letters*, vol 107, 012401, 2015]. Note that although an external magnetic field is applied to assist spin-Hall switching in FIG. 6(b), the external field is not necessary under field-free strategies [S. Fukami, et al., "Magnetization switching by sping-orbit torque in an antiferromagnet—ferromagnet bilayer system," *Nature Materials*, vol. 15, pp. 535-541, 2016][Z. Zhao, et al., "External-field-free spin Hall switching of perpendicular magnetic nanopillar with a dipole-coupled composite structure", arXiv:1603.09624, 2017]. Note that the choice for L, W, and t is based on an optimization described in Sec. 3C.

For each gate, we can define Noise Margin (NM) of V$_b$, which is defined as [M. Zabihi, et al., "In-memory processing on the spintronic CRAM: From hardware design to application mapping," *IEEE Transactions on Computers, Early Access*, Vol. 68, No. 8, pp. 1159-1173, August 2019:

$$NM = \frac{V_{max} - V_{min}}{V_{mid}}, V_{mid} = \frac{(V_{max} + V_{min})}{2} \quad (11)$$

where V$_{max}$ and V$_{min}$ are, respectively, the upper and lower limits on V$_b$, and V$_{mid}$ is the midpoint of the bias voltage range.

To maximize noise immunity, we chose V$_{mid}$ as the actual applied voltage. The energy, E, dissipated by each gate, is $$E = V_{mid} I_{SOT} t_{SOT}. \quad (12)$$

Figure 7:
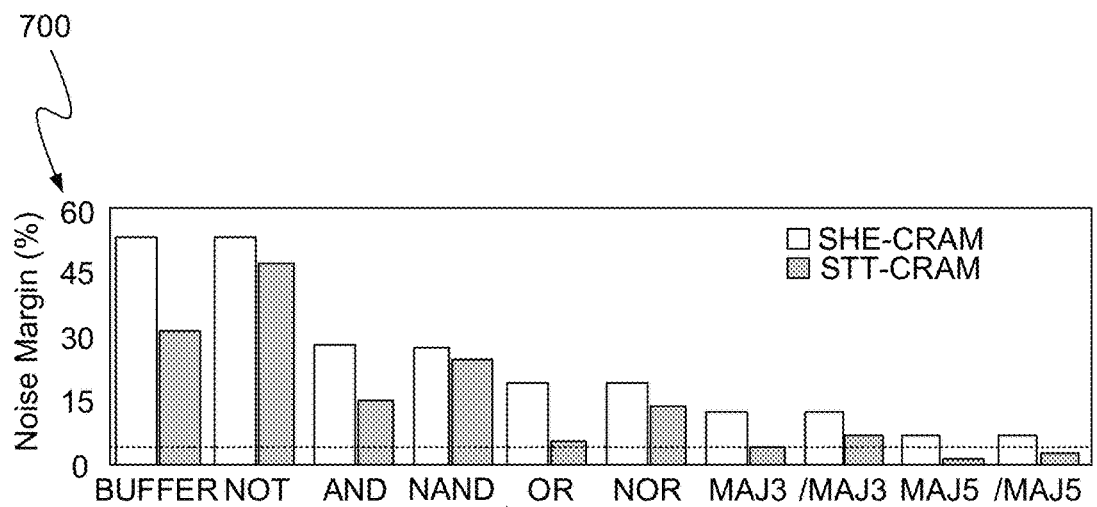
FIG. 7 provides a chart showing comparisons of noise margins between gates implemented using STT-CRAM and SHE-CRAM for different logic gates.
Figure 8:
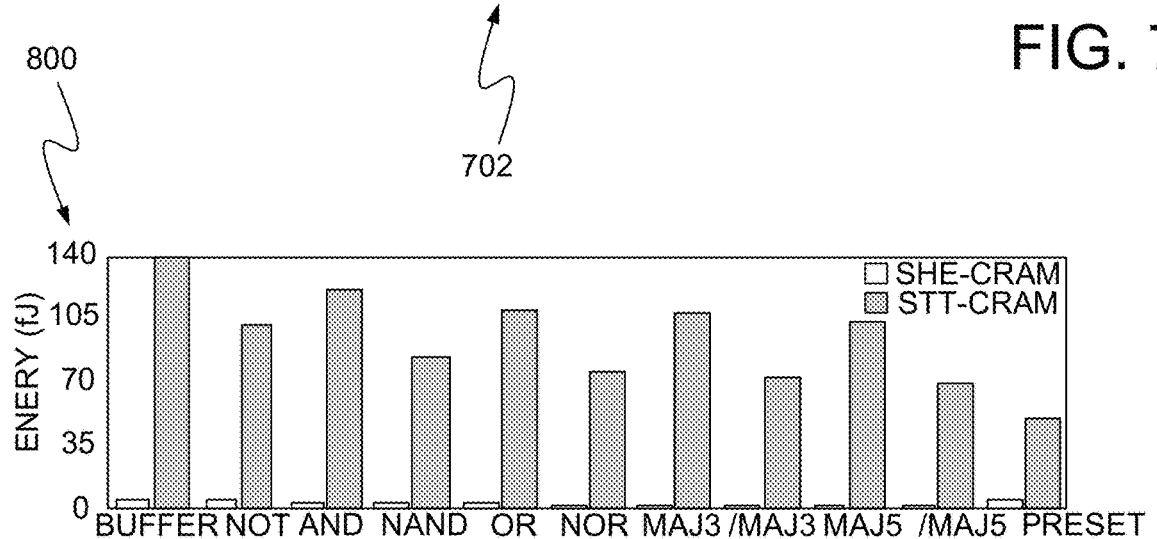
FIG. 8 provides a chart showing comparisons of energy consumed by gates implemented using STT-CRAM and SHE-CRAM for different logic gates.

Using the values in Table 3, the NM and energy for various SHE-CRAM based logic implementations are computed. We compare the noise margin and energy of logic operations in the STT-CRAM for today's STT-MTJs as reported in [M. Zabihi, et al., "In-memory processing on the spintronic CRAM: From hardware design to application mapping," *IEEE Transactions on Computers*, Vol. 68, No. 8, pp. 1159-1173, August 2019], and the SHE-CRAM in FIG. 7, where noise margin is shown along vertical axis 700 and various devices implemented in STT-CRAM and SHE-CRAM are shown along horizontal axis 702. From FIG. 7, the SHE-CRAM always results in higher noise margins compared to STT-CRAM. This can be attributed to the fact that the resistances ($R_{MTJ}$) associated with the logic inputs are significantly higher than the resistance $R_{SHE}$ associated with the output, which provides a larger allowable interval for $V_b$. In contrast, the inputs and outputs for the STT-CRAM are both correspond to MTJ resistances. A comparison of energy-efficiency is depicted in FIG. 8 where energy is shown along vertical axis 800 and various device implemented in STT-CRAM and SHE-CRAM are shown along horizontal axis 802. FIG. 8 shows that in all cases, the SHE-CRAM has better E, which can be attributed to lower switching current and faster switching time in SHE-CRAM than in STT-CRAM.

C. Optimization of Spin-Hall Channel Dimensions

To further improve device performance, we can optimize the dimensions of spin-Hall channel in the SHE-MTJ device with respect to NM and E. The spin-Hall channel resistance is $$R_{SHE} = R_{Sheet}\left(\frac{L}{W}\right) \quad (13)$$

where L≥W. For a NAND (or AND) gate, from eq. (11), $$NM_{NAND} = \frac{R_2\left(1 - \frac{R_1}{R_1 + R_2}\right)}{\frac{R_2}{2} + \frac{R_1 R_2}{R_1 + R_2} + 2R_3}. \quad (14)$$

Similarly, energy for the implementation of a NAND (or AND) gate can be rewritten as:

$$E_{NAND} = (WtJ_{SHE})^2\left(\frac{R_2}{4} + \frac{R_1 R_2}{2(R_1 + R_2)} + R_3\right)t_{SHE} \quad (15)$$

In FIGS. 9(*a*) and 9(*b*), the corresponding noise margin and energy of a NAND (or AND) gate are shown. In FIG. 9(*a*), by reducing the length to width ratio (L/W) of the SH channel, $R_{SHE}$ decreases. In each case, the optimal $V_b$ that maximizes the noise margin NM is found as the midpoint of the allowable interval of $V_b$. While NM depends on $R_P$ and $R_{AP}$ as well as $R_{SHE}$, it can be shown (by examining the sensitivity of NM to $R_{SHE}$) that NM is most sensitive to the reduction in $R_{SHE}$ (details omitted due to space limitations). This causes NM to decrease with increasing (L/W). Increasing the channel thickness t reduces $R_{sheet}$, thus decreasing $R_{SHE}$: as before, this increases NM.

In FIG. 9(*b*), by increasing L/W (or t), the energy increases. To maximize noise margin and minimize energy, L/W should be as small as possible (due to fabrication considerations the ratio is considered 2 rather than 1). For the choice of t, a balance between NM and energy must be found. Although a larger thickness increases NM, it increases the energy. As a compromise, based on FIGS. 9(*a*) and 9(*b*), we choose a near middle point of t=4 nm (providing 32% energy improvement with 3% degradation in NM compared to the middle point of 5 nm).

D. Functional-Level Design i. Full Adders

The original STT-CRAM [J.-P. Wang and J. D. Harms, "General structure for computational random access memory (CRAM)," U.S. Pat. No. 9,224,447 B2, Dec. 29 2015] built a NAND based implementation of full adder (FA) using 9 steps. Using majority logic one can implement a FA, as shown in FIG. 10, and this requires only 3 steps [Z. Chowdhury, et al., "Efficient in-memory processing using spintronics," *IEEE Computer Architecture Letters*, vol. 17, pp. 42-46, 2017]. STT-CRAM technology has very limited NM for majority gates; in contrast, the NM in SOT-CRAM is sufficiently high that majority implementations are realistic. However, the SOT-CRAM array in FIG. 3 is limited by the fact that all input operands must be in even columns, and the output must be in an odd column, or vice versa. This affects multi-step operations where some intermediate results, which act as operands for the next step, may be in even columns, while others may be in odd columns. This requires additional steps to move some operands.

Figure 11:
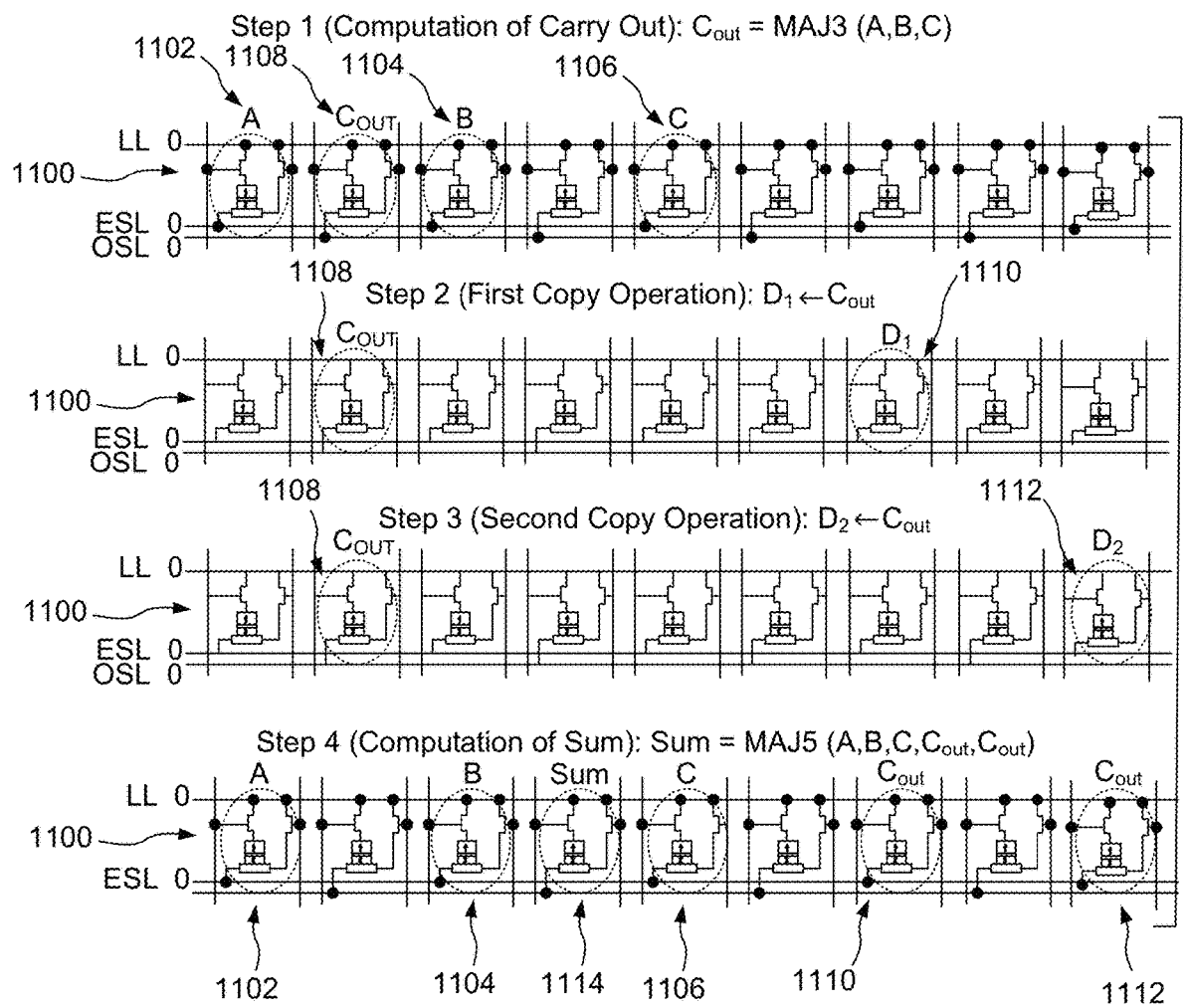
FIG. 11 is a schematic diagram for the implementation of a Full Adder using four steps based on majority logic in a row using SOT-CRAM.

FIG. 11 shows that the implementation of a majority logic based FA in a row 1100 of the SOT-CRAM array requires 4 steps. In step 1, $C_{out}$←MAJ3(A, B, C) is calculated: the inputs are in even columns (1102, 1104 and 1106) and the output is in odd column 1108. In step 2, $C_{out}$ is copied from odd column 1108 to even column 1110 by reading the value from odd column 1108 and writing the value to even column 1110. At step 3, $C_{out}$ is copied from odd column 1108 to even column 1112. Finally, in step 4, with all operands in even-numbered columns, we compute Sum←MAJ5(A, B, C, $C_{out}$, $C_{out}$) by using even columns 1102, 1104, 1106, 1110 and 1112 as the input values and using odd column 1114 to generate and store the output sum.

Note that due to the SOT-CRAM structure, $C_{out}$ computed in step 1 cannot be used directly for computation of Sum and must be copied twice to proper locations at Step 2 and Step 3, meaning that this operation requires 4 steps, unlike the STT-CRAM, which would require 3 steps; however, as stated earlier, SOT-CRAM provides better NM than STT-CRAM.

ii. Multi-Bit Adders

Figure 12:
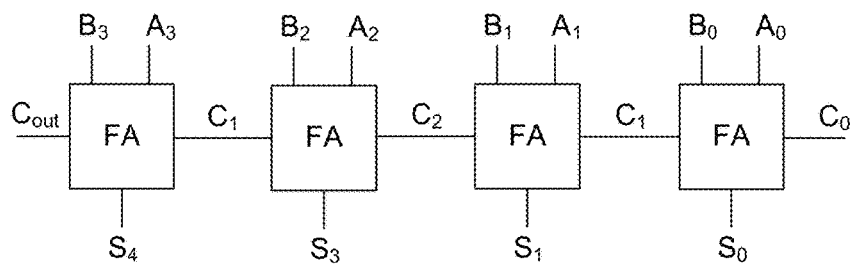
FIG. 12 is a block diagram of 4-bit ripple carry adder using four Full Adders.
Figures 13, 14:
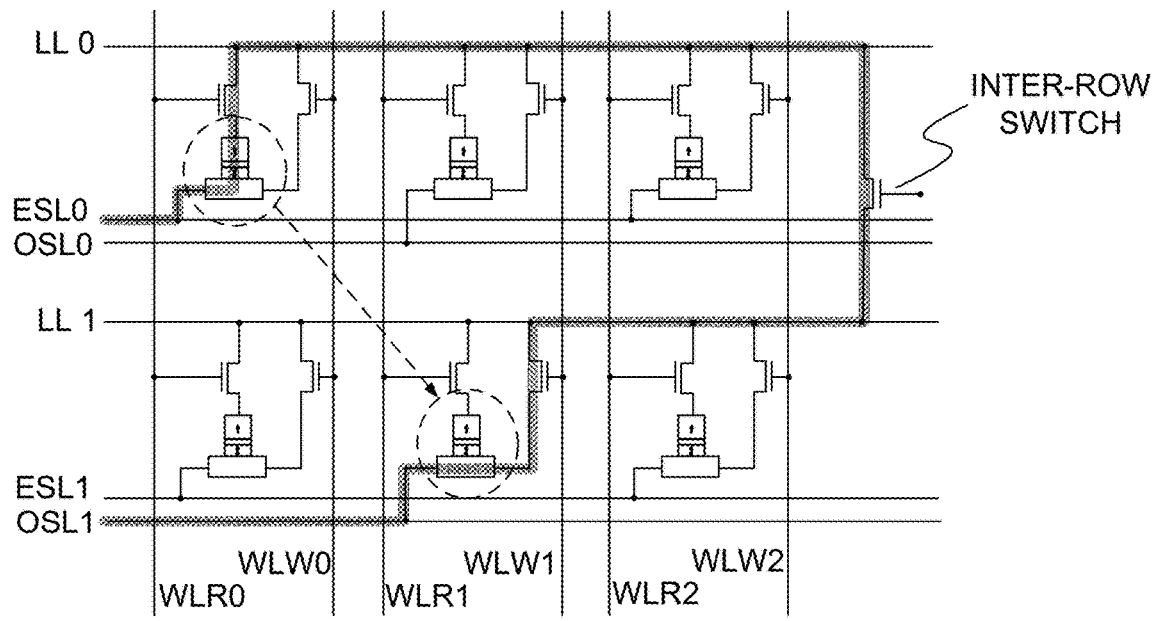
FIG. 13 is a scheduling table for a 4-bit ripple carry adder.
FIG. 14 is a schematic diagram showing inter-row transfer between cells in two adjacent rows using switches inserted between rows.

Using the majority logic-based FA, we show the implementation of a 4-bit ripple carry adder (FIG. 12), with the computations scheduled as shown in FIG. 13. At step 1, $C_1$ is generated in row 0. At step 2, $C_1$ is transferred to row 1. Similarly, the generated Carrys from the second FA (implemented in row 1) and third FA (implemented in row 2) are transferred to rows 2 and 3 at steps 4 and 6, respectively. Once all Carrys are generated in their corresponding rows, we can copy Carrys twice to proper locations ($D_1$ to $D_8$), and then compute Sums (recall that input operands are required to be in all-even or all-odd columns). We transfer the Carry from one row to its adjacent row using inter-row switches (FIG. 14).

Figure 15:
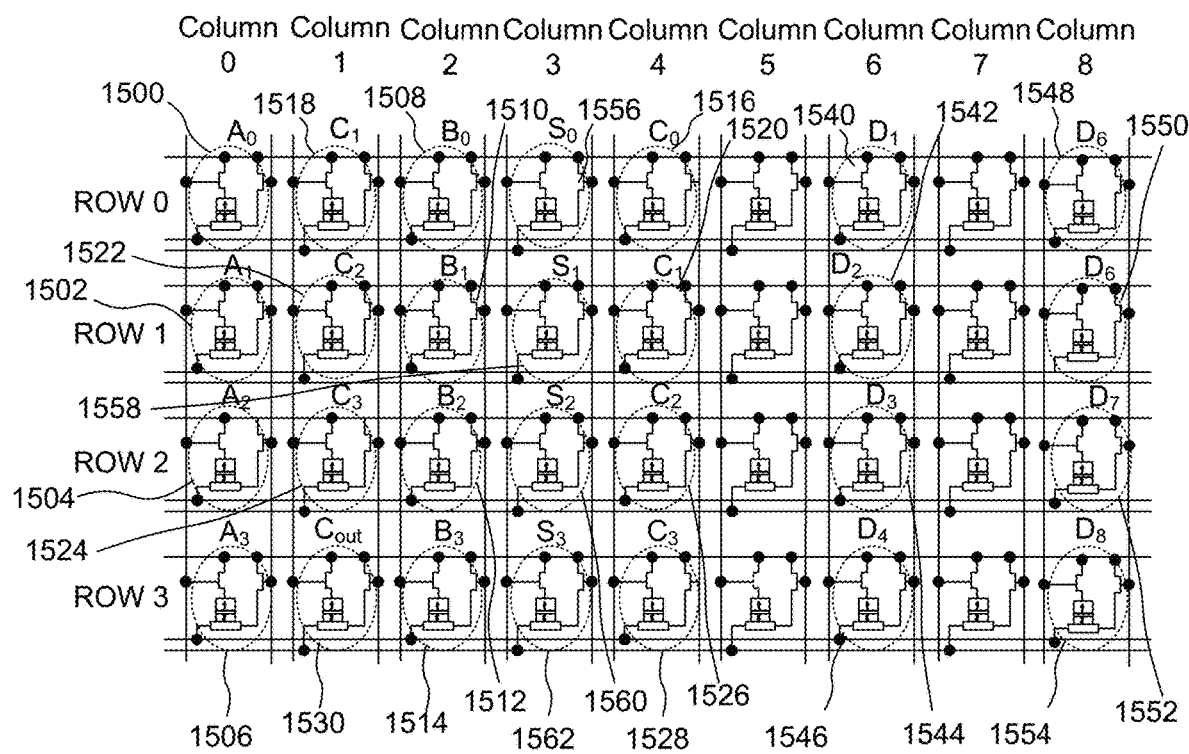
FIG. 15 is a schematic diagram of a SOT-CRAM array implementing the 4-bit ripple carry adder and showing the data layout at the end of step ten.

FIG. 15 shows the data layout of the 4-bit ripple carry adder at the end of step 10. Initially, the bits of 4-bit input number $A_3A_2A_1A_0$ are stored in cells 1500, 1502, 1504 and 1506 and the bits of 4-bit input number $B_3B_2B_1B_0$ are stored in cells 1508, 1510, 1512, and 1514, respectively, of row 0. Carry-in $C_0$ is stored in cell 1516. At step 1, $C_1$ is calculated in cell 1518, and at step 2 it is transferred to cell 1520 in row 1.

Similarly, $C_2$ and $C_3$ are generated in cells 1522 and 1524 of row 1 and row 2, respectively, and are transferred to cells 1526 of row 2 and 1528 of row 3 between step 3 and 6. At step 7, $C_{out}$ is calculated in cell 1530. The content of cells 1518, 1522, 1524 and 1530 is then copied to cells 1540, 1542, 1544, and 1546 in parallel and to cells 1548, 1550, 1552, and 1554, in parallel, based on the abovementioned schedule. Finally, at step 10, $S_0$, $S_1$, $S_2$, and $S_3$ are calculated in cells 1556, 1558, 1560 and 1562 in parallel.

Figure 16:
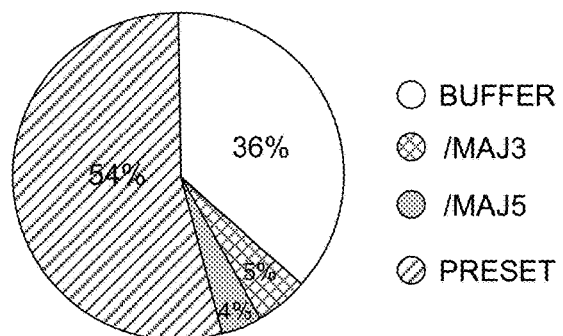
FIG. 16 is a chart showing the energy distribution for the implementation of 4-bit ripple carry adder using SOT-CRAM.

The execution time is determined by counting the number of steps and multiplying them by the logic delay for a majority function, which is dominated by the MTJ switching time. The energy is calculated by considering numbers of gates and their corresponding energy (Table 4). The dominant energy component of this implementation is related to the output presetting of gates (see FIG. 16).

iii. Row-Level Parallelism

The SOT-CRAM array structure described above allows only one type of logic function in a row at a time. This is because there is only one LL that spans the entire row, and any cell within the row to participate in computation gets directly connected to this LL.

On the other hand, the voltage levels on BSLs determine the type of the logic function, where each BSL spans an entire row. Furthermore, in each column, each WLW and WLR—which connect cells participating in computation to LL—span an entire column. Therefore, all rows can perform the very same logic function in parallel, on the same set of columns. In other words, the SOT-CRAM array supports a special form of SIMD (single instruction multiple data) parallelism, where instruction translates into logic gate/operation; and data, into input cells in each row, across all rows, which span the very same columns.

Multi-step operations are carried out in each row independently, one step at a time, while all rows operate in parallel. The output from each logic step performed within a row stays in that row, and can serve as input to subsequent logic steps (performed in the same row). All rows follow the same sequence of operations at the same time. In case of a multi-bit full adder, as an example, the Carry and Sum bits are generated in the same row as the input bits, which are used in subsequent 1-bit additions in the very same row.

To summarize, the SOT-CRAM array can have part or all rows computing in parallel, or the entire array serving as memory. Regular memory reads and writes cannot proceed simultaneously with computation. Large scale pattern matching problems can greatly benefit from this execution model.

More complex building blocks: Similar principles can be used to implement structures such as multipliers and dot products, which can be integrated to implement applications using SOT-CRAM; details are omitted due to space limitations.

4. Application-Level Analysis i. 2-D Convolution & Digit Recognition

To benchmark SOT-CRAM performance at the application level, we study its performance when it is deployed on two applications that were analyzed for the STT-CRAM in [M. Zabihi, et al., "In-memory processing on the spintronic CRAM: From hardware design to application mapping," *IEEE Transactions on Computers*, Vol. 68, No. 8, pp. 1159-1173, August 2019]: (a) 2-D convolution, where a 512×512 image is filtered using a 3×3 filter, and (b) neuromorphic digit recognition using 10K testing images in the MNIST database.

For both applications, we compare the energy and execution time using SOT-CRAM, STT-CRAM, and a near-memory processing (NMP) system (representative of current state-of-the-art). The NMP system places a processor at the periphery of a memory, and is superior to a system in which data is fetched from memory to processor (or coprocessor) [S. W. Keckler, et al., "GPUs and the future of parallel computing," *IEEE Micro*, vol. 31, pp. 7-17, 11 2011] [M. Horowitz, "Computing's energy problem (and what we can do about it)," in *Proceedings of the IEEE International Solid-State Circuits Conference*, pp. 10-14, 201411 J. Jeddeloh and B. Keeth, "Hybrid memory cube new DRAM architecture increases density and performance," in *Proceedings of the IEEE International Symposium on VLSI Technology*, pp. 87-88, 2012]. Also, note that in evaluations of STT-CRAM and SOT-CRAM, the effect of peripheral circuitry is considered.

The results of the comparison are presented in Table 5. SOT-CRAM outperforms STT-CRAM in both execution time and energy, and both SOT-CRAM and STT-CRAM beat the NMP system in term of energy and execution time. In both applications, SOT-CRAM is at least 4× more energy efficient, and 3× faster than STT-CRAM. For 2-D convolution, SOT-CRAM is over 2000× faster, and 130× more energy-efficient than an NMP system. The corresponding numbers for the neuromorphic application are over 4000× and 190×, respectively.

TABLE 4

Counts of gates and their corresponding energy values for the calculation of the energy required for the implementation of the 4-bit ripple carry adder.

|  | BUFFER | /MAJ3 | /MAJ5 | PRESET | Total Energy (fJ) |
|---|---|---|---|---|---|
| Number of gates | 11 | 4 | 4 | 19 |  |
| Energy/gate (fJ) | 4.34 | 1.76 | 1.30 | 3.74 |  |
| Total Energy (fJ) | 47.74 | 7.04 | 5.12 | 71.06 | 130.96 |

TABLE 5

Comparison between execution time and energy of NMP, SOT-CRAM, and STT-CRAM. The CMOS-based NMP data is based on the calculations in [M. Zabihi, et al., "In-memory processing on the spintronic CRAM: From hardware design to application mapping," *IEEE Transactions on Computers*, Vol. 68, No. 8, pp. 1159-1173, August 2019].

| Application | Parameters | NMP | STT-CRAM | SHE-CRAM |
|---|---|---|---|---|
| 2-D Convolution | Execution Time | 144.4 μs | 231 ns | 63 ns |
|  | Energy | 388.6 μJ | 16.5 μJ | 2.9 μJ |
| Digit Recognition | Execution Time | 1.96 ms | 1105 ns | 408 ns |
|  | Energy | 2.57 mJ | 63.8 μJ | 13.5 μJ |

The improvements in SOT-CRAM over the STT-CRAM can be attributed to the speed and energy-efficiency of the SOT-MTJ device. Note that the ratio of speed improvement is almost the same as the 3× improvement of the SOT-MTJ over the STT-MTJ, but the energy improvement is less than the ratio of STT-MTJ to SOT-MTJ switching energy, primarily because of the significant energy overhead of the peripheral driver circuitry of the memory array. Using larger subarrays in the memory can provide up to 25% energy improvements, while degrading the speedup from 3× to just over 2×.

The superiority of both CRAMs over the NMP system can be attributed to the low memory access time of the in-memory computing paradigm, and high levels of available parallelism in CRAM. In contrast, in the NMP system, the energy and execution time consists of two components: (a) fetching data from the memory unit, and (b) processing data in processor units. We can have maximum parallelism in a NMP systems by using multiple processor units and latency hiding techniques, but energy and execution time cost of fetching data from the memory are a severe bottleneck. This bottleneck does not exist in the CRAM due to data locality.

ii. Pattern Matching

Pattern matching is a key computational step in large-scale data analytics. The most common form by far is character string matching, which involves repetitive search over very large databases residing in memory. The SOT-CRAM array discussed above allows the string matching to be performed within the memory holding the character strings thereby avoiding latency and energy overhead associated with transferring the character data from the memory to a processor to perform string matching as found in prior art systems. As a representative and important large-scale string-matching problem, in the following, we will use DeoxyriboNucleic Acid (DNA) sequence pre-alignment as a running example, however, those skilled in the art will recognize that SOT-CRAM can be applied to any string-matching application.

DNA sequence pre-alignment tries to map a short character string to (the most similar substring of) an orders-of-magnitude-longer character string, and repeats this process for a very large number of short strings, where the longer string is fixed and acts as a reference. For each string, the characters come from the alphabet A(denine), C(ytosine), G(uanine), and T(hymine). The long string represents a complete genome; short strings, short DNA sequences (from the same species). The goal is to extract the region of the reference genome to which the short DNA sequences correspond to. We will refer to each short DNA sequence as a pattern, and the longer reference genome as reference.

Aligning each pattern to the most similar substring of the reference usually involves character by character comparisons to derive a similarity score, which captures the number of character matches between the pattern and the (aligned substring of the) reference. Improving the throughput performance in terms of number of patterns processed per second in an energy-efficient manner is especially challenging, considering that a representative reference (i.e., the human genome) can be around $10^9$ characters long, that at least 2 bits are necessary to encode each character, and that a typical pattern dataset can have hundreds of millions patterns to match.

By effectively pruning the search space, DNA pre-alignment can significantly accelerate DNA sequence alignment—which, besides complex pattern matching in the presence of errors, include pre- and post-processing steps typically spanning (input) data transformation for more efficient processing, search space compaction, or (output) data re-formatting. The execution time share of pattern matching (accounting for possible complex errors in patterns and the reference) can easily reach 88% in highly optimized GPU implementations of popular alignment algorithms. In the following, we will only cover basic pattern matching (which can still account for basic error manifestations in the patterns and the reference) within the scope of pre-alignment.

Mapping any computational task to the SOT-CRAM array translates into co-optimizing the data layout, data representation, and the spatio-temporal schedule of logic operations, to make the best use of SOT-CRAM's column-level parallelism. This entails distribution of the data to be processed, i.e., the reference and the patterns, in a way such that each row can perform independent computations.

The data representation itself, i.e., how we encode each character of the pattern and the reference strings, has a big impact on both the storage and the computational complexity. Specifically, data representation dictates not only the type, but also the spatio-temporal schedule of (bit-wise) logic operations. Spatio-temporal scheduling, on the other hand, should take intermediate results during computation into account, which may or may not be discarded (i.e., overwritten), and which may or may not overwrite existing data, as a function of the algorithm or array size limitations.

a. Data Layout & Data Representation

We use the data layout captured by FIG. 17, by folding the long reference over multiple SOT-CRAM rows. Each row has four dedicated compartments to accommodate a fragment of the folded reference; one pattern; the similarity score (for the pattern when aligned to the corresponding fragment of the reference); and intermediate data (which we will refer to as scratch). The same format applies to each row, for efficient row-parallel processing. Each row contains a different fragment of the reference.

We determine the number of columns allocated for each of the four compartments, as follows: In the DNA pre-alignment problem, the reference corresponds to a genome, therefore, can be very long. The species determines the length. As a case study for large-scale pattern matching, in this paper we will use approx. $3 \times 10^9$ character-long human genome. Each pattern, on the other hand, represents the output from a DNA sequencing platform, which biochemically extracts the location of the four characters (i.e., bases) in a given (short) DNA strand. Hence, the sequencing technology determines the maximum length per pattern, and around 100 characters is typical for modern platforms processing short DNA strands. The size of the similarity score compartment, to keep the character-by-character comparison results, is a function of the pattern length. Finally, the size of the scratch compartment depends on both the reference fragment and pattern length.

While the reference length and the pattern length are problem-specific constants, the (reference) fragment length (as determined by the folding factor), is a design parameter. By construction, each fragment should be at least as long as each pattern. The maximum fragment length, on the other hand, is limited by the maximum possible row height, considering the maximum affordable capacitive load (hence, RC delay) on row-wide control lines such as BSL and LL. However, row-level parallelism favors shorter fragments (for the same reference length). The shorter the fragments, the more rows would the reference occupy, and the more rows, hence regions of the reference, would be "pattern-matched" simultaneously.

For data representation, we simply use 2-bits to encode the four (base) characters, hence, each character-level comparison entails two bit-level comparisons.

In accordance with one embodiment, the following Algorithm is used to determine a score for each fragment. This algorithm is implemented in each row of the SOT-CRAM and as a result the scores for each fragment are determined in parallel.

```
Algorithm 1 2-phase pattern matching at column-level
    loc = 0
    while loc < len(fragment)-len(pattern) do
        Phase-1: Match (Aligned Comparison)
        align pattern to location loc of reference fragment;
        (bit-wise) compare aligned pattern to fragment
        Phase-2: Similarity Score Computation
        count the number of character-wise matches;
        derive similarity score from count
        loc + +
    end while
```

In Algorithm 1, len(fragment) and len(pattern) represent the (character) length of the reference fragment and the pattern, respectively; and loc, the index of the fragment string where we align the pattern for comparison. The computation in each column starts with aligning the fragment and the pattern string, from the first character location of the fragment onward. For each alignment, a bit-wise comparison of the fragment and pattern characters comes next. The outcome is a len(pattern) bits long string, where a 1 (0) indicates a character-wise (mis)match. We will refer to this string as the match string. Hence, the number of 1s in the match string acts as a measure for how similar the fragment and the pattern are, when aligned at that particular character location (loc per Algorithm 1).

A reduction tree of 1-bit adders counts the number of is in the match string to derive the similarity score. Once the similarity score is ready, next iteration starts. This process continues until the last character of the pattern reaches the last character of the fragment, when aligned.

Figure 18A:
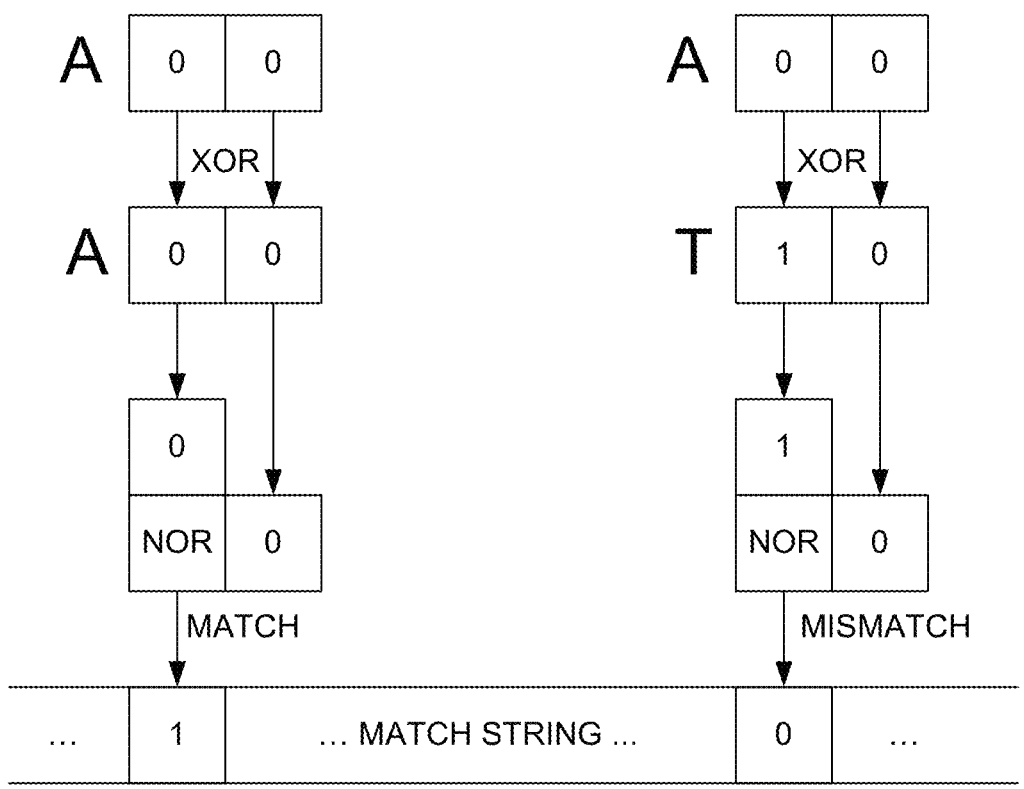
FIG. 18(a) shows aligned bit-wise comparison.

Phase-1 (Match, i.e., Aligned Comparison):

Each aligned character-wise comparison gives rise to two bit-wise comparisons, each performed by a 2-input XOR gate. FIG. 18a provides an example, where we compare the base character 'A' (encoded by '00') of the fragment with the base character 'A' (i), and 'T' (encoded by '10') (ii), of the pattern. A 2-input NOR gate converts the 2-bit comparison outcome to a single bit, which renders a 1 (0) for a character-wise (mis)match. Recall that a NOR gate outputs a 1 only if both of its inputs are 0, and that an XOR gate generates a 0 only if both of its inputs are equal.

The SOT-CRAM array can only have one gate active per row at a time. Therefore, for each alignment (i.e., for each loc or iteration of Algorithm 1), such a 2-bit comparison takes place len(pattern) times in each row, one after another. Thereby we compare all characters of the aligned pattern to all characters of the fragment, before moving to the next alignment (at the next location loc per Algorithm 1). That said, each such 2-bit comparison takes place in parallel over all rows, where the very same columns participate in computation.

Figure 18B:
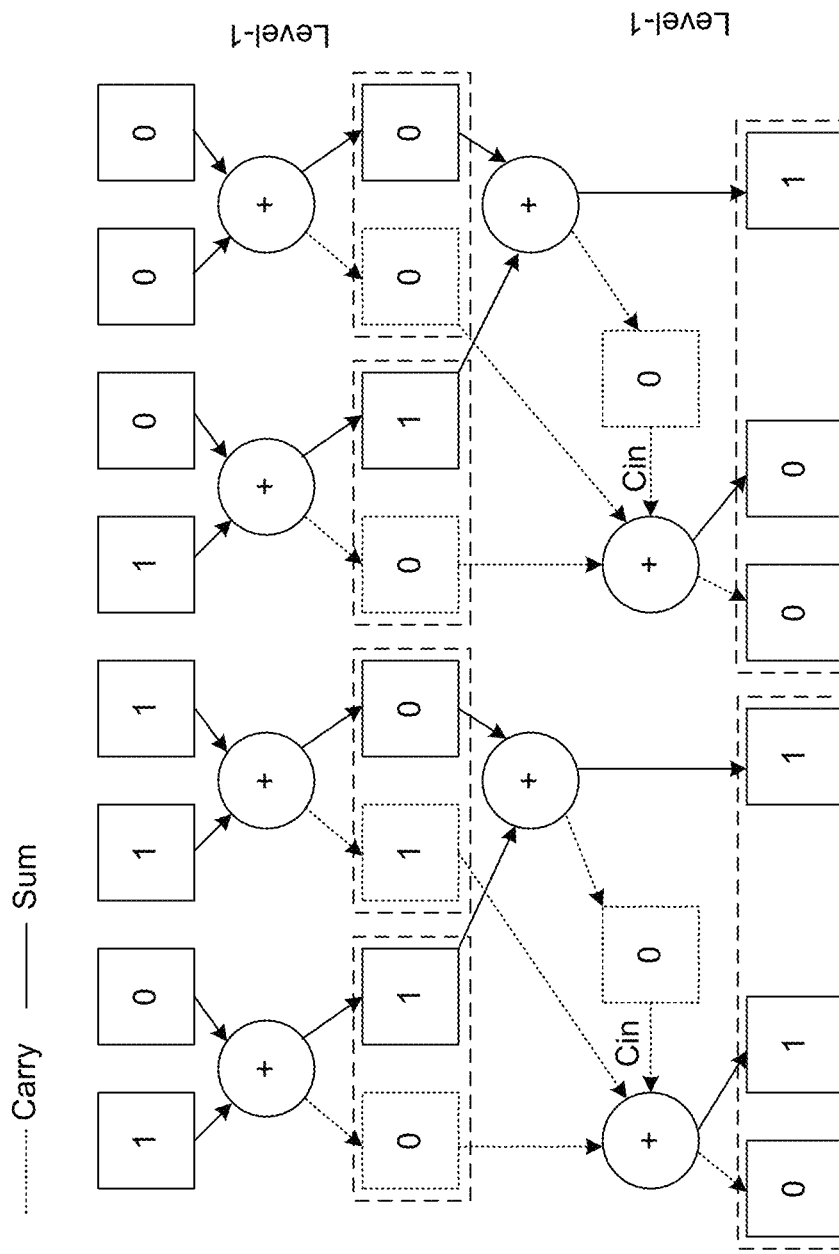
FIG. 18(b) shows an adder reduction tree used for similarity score computation.

Phase-2 (Similarity Score Computation):

For each alignment (i.e., iteration of Algorithm 1), once all bits of the match string are ready—i.e., the character-wise comparison of the fragment and the aligned pattern string is complete for all characters, we count the number of 1s in the match string to calculate the similarity score. A reduction tree of 1-bit adders performs the counting, as captured by FIG. 18b, with the carry and sum paths shown explicitly for the first two levels. The top row corresponds to the contents of the match string; and each ⊕, to a 1-bit adder. len (pattern), the pattern length in characters, is equal to the match string length in bits. Hence, the number of bits required to hold the final bit-count (i.e., the similarity score) is $N=\lfloor \log_2[\text{len(pattern)}] \rfloor+1$. A naive implementation for the addition of len(pattern) number of bits requires len(pattern) steps, with each step using an N-bit adder, to generate an N-bit partial sum towards the N-bit end result. For a typical pattern length of around 100, this translates into approx. 100 steps, with each step performing a N=7 bit addition. Instead, to reduce both the number of steps and the operand width per step, we adopt the reduction tree of 1-bit adders from FIG. 18b. Each level adds bits in groups of two, using 1-bit adders. For a typical pattern length of around 10, we thereby reduce the complexity to 188 1-bit additions in total.

Alignment under basic error manifestations in the pattern and the reference is also straight-forward in this case. For DNA sequence alignment, the most common errors take the form of substitutions (due to sequencing technology imperfections and genetic mutations), where a character value assumes a different value than actual. We can set a tolerance value t (in terms of number of mismatched characters) based on expected error rates and pass an alignment as a "match" if less than t characters mismatch.

Assignment of Patterns to Rows:

In each SOT-CRAM array we can process a given pattern dataset in different ways. We can assign a different pattern to each row, where a different fragment of the reference resides, or distribute the very same pattern across all rows. Either option works as long as we do not miss the comparison of a given pattern to all fragments of the reference. In the following, we will stick to the second option, without loss of generality. This option eases capturing alignments scattered across rows (i.e., where two consecutive rows partially carry the most similar region of the reference to the given pattern). A large reference can also occupy multiple arrays and give rise to scattered alignments at array boundaries, which row replication at array boundaries can address.

Many pattern matching algorithms rely on different forms of search space pruning to prevent unnecessary brute-force search across all possibilities. At the core of such pruning techniques lies indexing the reference, which is known ahead of time, in order to direct detailed search for any given pattern to the most relevant portion of the reference (i.e., the portion that most likely incorporates the best match). The result is pattern matching at a much higher throughput. In accordance with one embodiment, each pattern and the reference are chunked into substrings of known length, and a hash (bit) is created for each substring. Thereby, both the pattern and the reference become bit-vectors, of much shorter length than their actual representations. Search space pruning in this embodiment simply translates into bit-wise comparison of each pattern bit-vector to the (longer) reference bit-vector, within the memory array, in a similar fashion to the actual full-fledged pattern mapping algorithm, considering all possible alignments exploiting SOT-CRAM's massive parallelism at the row level. Thereby we eliminate unnecessary attempts for full-fledged matching (using actual data representation and not hashes).

iii. Energy Harvesting

In other embodiments, SOT-CRAM is used in systems that rely on energy harvesting. Energy harvesting systems are powered by their environment. If the environment does not provide enough power, the system will have to accumulate energy over time and consume it in bursts. Therefore, such devices must consume as little energy as possible and be capable of tolerating power outages while maintaining program correctness. SOT-CRAM is a natural fit for such a paradigm as logic operations are highly energy efficient and the memory is entirely non-volatile. Additionally, all computations occur within the memory so progress is effectively saved after each operation. This greatly simplifies strategies to maintain correctness.

In accordance with one embodiment, a system for ensuring data and program correctness using SOT-CRAM in an environment that experiences power interruptions includes:

1. One or more SOT-CRAM arrays;

2. A memory controller that reads instructions from a portion of the SOT-CRAM array and issues the instructions to other portions of the SOT-CRAM array;

3. An 128B memory buffer that facilitates communication between different portions of the SOT-CRAM array(s);

4. A non-volatile register for a program counter;

5. A non-volatile register for storing a single instruction;

6. A Voltage sensing circuitry for monitoring the power source.

In accordance with one embodiment, there are three types of instructions: logic operations, memory operations, and row activation. Memory operations are the same as standard read and write operations for STT-MRAM. Instructions for logic operations specify the type of operation (which determines the applied voltage level) and the columns on which input and output cells reside. When a logic instruction is issued, it will be applied to every row that is currently active. Row are activated by the Activate Rows instruction, which provides a list of row addresses to a row decoder. Once rows are activated they are held active by a latching mechanism. This allows rows to remain active over multiple instructions. As rows need to be changed infrequently, typically staying active for many instructions, the peripheral cost for activation is amortized. This cost is further reduced by modifying the encoding to allow for bulk addressing.

Once active, the memory controller fetches each instruction from the SOT-CRAM cells containing the instructions, decodes it, and then broadcasts it to the SOT-CRAM rows storing data. Instructions vary in the amount of time they take to complete. This is because specifying row and column addresses has an associated latency, and different instructions have different numbers of addresses. Logic operations can use 2 or 3 columns and row activation can specify up to 5 rows. To ensure that every instruction finishes, the memory controller waits longer than the longest instruction before issuing the next. This does not impact performance as, due to power restrictions of energy harvesting sources, the memory controller does not issue instructions as fast as possible. Hence, this wait period can use already existing spare time.

As energy harvesting systems frequently experience power outages, they must be designed to perform intermittent processing. This involves addressing the challenge of maintaining correct state while repeatedly shutting down and restarting. The mechanism for maintaining state also need be efficient, as to avoid consuming the precious energy available for program execution. The system in accordance with one embodiment, maintains correctness with just the program counter (PC) and an additional non-volatile status bit. As SOT-CRAM performs all computation within the non-volatile memory, progress is inherently saved after each operation. This makes restarting after the last instruction possible and ideal.

When the system restarts, only two pieces of information are required: the last instruction that was performed and the rows that were active. In order to restart from the last instruction, the system writes the program counter into a non-volatile register after each instruction is executed. During a restart, the next instruction is read from the address in the program counter. In the worst case, the power is cut after the last instruction is issued and performed, but before the update to the program counter register. This does not break correctness as the same result is obtained if a single instruction is repeated multiple times, meaning it is idempotent. The only requirement is that the program counter update happens strictly after each instruction is performed. Restarting after the very last instruction not only minimizes the amount of work potentially lost on shutdown, but it simplifies the restart process. The simple correctness guarantee, an operation being idempotent, does not hold if we were to repeat multiple instructions. This is because over the course of multiple instructions, multiple temporary values can be created. These temporary values may be used later in the computation or periodically overwritten. Repeating multiple instructions on startup would require some method for ensuring correctness of these temporary values, such as performing additional presetting operations. This is certainly possible to do, but it introduces additional complexity.

The second requirement is to restore the previously active rows, for which we use a similar procedure. Whenever an activate rows instruction is issued, it is stored in an additional instruction register. Reissuing this last activate row instruction is the first action on restart. This scheme gives minimal backup and restart overhead.

The cost is 1) continuous update of the program counter and activate rows registers and 2) an additional issue of an activate rows instruction on every restart. Both of these actions incur far less energy than a typical logic instruction.

It is noteworthy that the embodiment is always in a state which is safe to shut down in. Hence, SOT-CRAM maintains correctness even if power is cut unexpectedly.

We make sure that operations happen in the correct order by performing them sequentially; updates to (architectural) state maintaining registers occur only after the current instruction is performed. If run at full speed, SOT-CRAM consumes more power than a typical energy harvesting source can provide. This requires us to reduce the rate at which we issue instructions. Hence, there is already a time slack between instructions, during which these updates to the architectural state can be performed.

SOT-CRAM holds all static data required and performs all the computations. To be integrated into an energy harvesting system, SOT-CRAM needs to receive energy from an energy harvester, receive input from a sensor, and send output to a transmitter. In this work, we assume input data is stored in a non-volatile buffer in the sensor prior to inference. The buffer contains a non-volatile valid bit indicating that new input is ready. When the SOT-CRAM array is ready for new input, the memory controller can check the valid bit and trigger a memory transfer. The memory transfer then consists of reads from the buffer and writes to the SOT-CRAM array. These reads and writes are controlled by instructions at the beginning of the program. When the SOT-CRAM array finishes inference, the memory controller reads out the data from the SOT-CRAM array. This data is then available to be transferred to transmitter.

In other embodiments, the SOT-CRAM array is utilized to implement artificial intelligence models such as Support Vector Machines. In accordance with one embodiment, each row of the SOT-CRAM array calculates the relationship between an input vector and a support vector and multiplies that relationship by a weight assigned to the support vector. The weighted values are then combined to produce a value that determines which of two classes the input vector represents. The SOT-CRAM array is particularly useful in systems that determine multiple classifications for the same input since the classifications can be determined in parallel.

5. Conclusion

SOT-CRAM leverages the speed and efficiency of the 3-terminal SOT device, and we demonstrate a new in-memory computing architecture using this device. We propose a design method which contains consideration in device, gate, and functional levels. At the device level, the 3-terminal SOT-MTJ integrated with highly efficient spin-orbit torque material is served as the unit cell of CRAM. At the gate level, we show that energy and noise margin of implementation of a gate using SOT-CRAM is always superior to those of STT-CRAM. Moreover, in one embodiment that uses the spin-Hall effect, we optimize the dimensions of the spin-Hall channel with respect to the noise margin and the implementation energy of a gate. At the functional level, we illustrate how a FA can be implemented in SOT-CRAM, principles that can be extended to more complex structures. Finally, at the application level, we have analyzed the SOT-CRAM performance for 2-D convolution and neuromorphic digit recognition and shown its application in pattern matching and energy harvesting.

In the embodiments, a new in-memory computation architecture based on the SOT memory devices has been proposed. The unique features and 3T configuration of the SOT memory cell make this invention surpass the previous STT-based CRAM from the following aspects:

(1) SOT-based CRAM array can implement universal logic gates (NOT, BUFFER, AND, NAND, OR, NOR, MAJ, etc.), with a better noise margin;
(2) It has a faster access and more reliable operations compared with STT-based CRAM;
(3) It consumes less energy than STT-based CRAM by utilizing high spin generation materials as the SOT channel;
(4) SOT-based CRAM array allows inter-row communication, which is forbidden in STT-based CRAM array.

In summary, the proposed SOT-CRAM can address current issues with STT-based CRAM and demonstrate a better performance.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms for implementing the claims.

What is claimed is:

1. A plurality of logic-memory cells comprising:
a first logic-memory cell comprising:
a first spin-orbit torque device having first, second and third terminals configured such that current between the second and third terminals of the first spin-orbit torque device is capable of changing a resistance between the first and second terminals of the first spin-orbit torque device, the second terminal of the first spin-orbit torque device connected to a first select line;
a first transistor connected between a logic connection line and the first terminal of the first spin-orbit torque device; and
a second transistor connected between the logic connection line and the third terminal of the first spin-orbit torque device; and
a second logic-memory cell comprising:
a second spin-orbit torque device having first, second and third terminals configured such that current between the second and third terminals of the second spin-orbit torque device is capable of changing a resistance between the first and second terminals of the second spin-orbit torque device, the second terminal of the second spin-orbit torque device connected to a second select line;
a third transistor connected between the logic connection line and the first terminal of the second spin-orbit torque device; and
a fourth transistor connected between the logic connection line and the third terminal of the second spin-orbit torque device.

2. The plurality of logic-memory cells of claim 1 wherein current passes through the first transistor when a read operation is performed on the first logic-memory cell.

3. The plurality of logic-memory cells of claim 2 wherein current passes through the second transistor when a write operation is performed on the first logic-memory cell.

4. The plurality of logic-memory cells of claim 1 wherein the first spin-orbit torque device comprises a magnetic tunnel junction and a spin-orbit torque channel.

5. The plurality of logic-memory cells of claim 4 wherein the second and third terminal are connected to opposing ends of the spin-orbit torque channel.

6. The plurality of logic-memory cells of claim 5 wherein the magnetic tunnel junction is located between the first terminal of the first spin-orbit torque device and the spin-orbit torque channel.

7. The plurality of logic-memory cells of claim 1 wherein current between the second and third terminals of the first spin-orbit torque device in a first direction is capable of increasing the resistance between the first and second terminals of the first spin-orbit torque device and current between the second and third terminals of the first spin-orbit torque device in a second direction is capable of decreasing the resistance between the first and second terminals of the first spin-orbit torque device.

8. A cell array comprising:
a plurality of cells comprising a first subset of cells and a second subset of cells;
a logic connection line connected to each cell in the plurality of cells;
a first select line connected to each cell in the first subset of cells;
a second select line connected to each cell in the second subset of cells;
a plurality of write lines, each write line connected to a respective cell in the plurality of cells; and
a plurality of read lines, each read line connected to a respective cell in the plurality of cells;
wherein during a logic operation, at least one of the plurality of read lines is used to connect at least one respective cell of the first subset of cells to the logic connection line to provide at least one respective input value for the logic operation and one of the plurality of write lines is used to connect a respective cell of the second subset of cells to the logic connection line to produce and store an output value for the logic operation.

9. The cell array of claim 8 wherein during the logic operation a voltage is applied between the first select line and the second select line.

10. The cell array of claim 8 wherein each cell comprises a spin-orbit torque device.

11. The cell array of claim 10 wherein each spin-orbit torque device comprises a magnetic tunnel junction and a spin-orbit torque channel wherein the respective read line for each cell controls current through the magnetic tunnel junction and the respective write line for each cell controls current through the spin-orbit torque channel.

12. The cell array of claim 8 further comprising:
a second plurality of cells;
a second logic connection line connected to each cell in the second plurality of cells;
wherein each write line is connected to a respective cell in the second plurality of cells and each read line is connected to a respective cell in the second plurality of cells.

13. The cell array of claim 12 further comprising a switching transistor connected between the logic connection line and the second logic connection line such that current flows from the logic connection line through the switching transistor to the second logic connection line.

14. The cell array of claim 13 wherein during a second logic operation a cell in the plurality of cells provides an input value for the second logic operation and a cell in the second plurality of cells produces and stores an output value for the second logic operation.

15. A method comprising:
setting a read line of a first cell and a write line of a second cell to cause current to pass through a magnetic tunnel junction of the first cell, through a logic connection line connecting the first cell and the second cell and through a spin-orbit torque channel of the second cell so as to execute a logic operation and store an output of the logic operation in the second cell.

16. The method of claim 15 wherein the second cell further comprises a second magnetic tunnel junction and the output of the logic operation is stored in the second magnetic tunnel junction.

17. The method of claim 16 wherein the first cell further comprises a spin-orbit torque channel and wherein the method further comprises before setting the read line of the first cell, setting a write line of the first cell to cause current to pass through the spin-orbit torque channel of the first cell to thereby store an input value for the logic operation in the magnetic tunnel junction of the first cell.

18. The method of claim 15 further comprising:
setting a read line of a third cell to cause current to pass through a magnetic tunnel junction of the third cell, through the logic connection line connecting the third cell and the second cell and through the spin-orbit torque channel of the second cell so as to execute the logic operation and store the output of the logic operation in the second cell.

19. The method of claim 18 wherein causing current to pass through the magnetic tunnel junctions of the first and third cell, the logic connection line and the spin-orbit torque channel of the second cell comprises applying a voltage between a first select line connected to the first and third cell and a second select line connected to the second cell.

20. A pattern matching system implemented in a cell array, wherein each cell in the cell array comprises spin-orbit torque device wherein current along a first path through the cell sets a resistance along a second path through the cell, the pattern matching system comparing a pattern to multiple references in parallel using the cell array.

21. A cell array that receives power from an energy harvesting system wherein each cell in the cell array comprises a spin-orbit torque device such that execution of an instruction in the cell array causes a result of the instruction to be stored in a non-volatile manner in a spin-orbit torque device of the cell array.

22. A cell array comprising:
a first plurality of cells;
a second plurality of cells;
a logic connection line connected to each cell in the first plurality of cells;
a second logic connection line connected to each cell in the second plurality of cells;
a plurality of write lines, each write line connected to a respective cell in the first plurality of cells and to a respective cell in the second plurality of cells;
a plurality of read lines, each read line connected to a respective cell in the first plurality of cells and to a respective cell in the second plurality of cells; and
a switching transistor connected between the logic connection line and the second logic connection line;
wherein during a logic operation, at least one of the plurality of read lines is used to connect at least one respective cell of the first plurality of cells to the logic connection line to provide at least one respective input value for the logic operation and one of the plurality of write lines is used to connect a respective cell of the second plurality of cells to the second logic connection line to produce and store an output value for the logic operation such that current flows from the logic connection line through the switching transistor to the second logic connection line.

* * * * *